(12) United States Patent
Lee et al.

(10) Patent No.: US 8,769,375 B2
(45) Date of Patent: Jul. 1, 2014

(54) DATA STORAGE DEVICE RELATED METHOD OF OPERATION

(75) Inventors: KeunJae Lee, Suwon-si (KR); Sung Hoon Baek, Daejeon (KR); Wonmoon Cheon, Hwaseong-si (KR); Jeong-Beom Seo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 142 days.

(21) Appl. No.: 13/440,114

(22) Filed: Apr. 5, 2012

(65) Prior Publication Data

US 2012/0260146 A1 Oct. 11, 2012

(30) Foreign Application Priority Data

Apr. 8, 2011 (KR) .......................... 10-2011-0032909

(51) Int. Cl.
*G11C 29/00* (2006.01)

(52) U.S. Cl.
USPC ....................................................... 714/763

(58) Field of Classification Search
None
See application file for complete search history.

(56) References Cited

U.S. PATENT DOCUMENTS

| | | | |
|---|---|---|---|
| 6,295,619 B1 | 9/2001 | Hasbun et al. | |
| 7,093,157 B2 * | 8/2006 | Hajji | 714/5.1 |
| 7,237,156 B1 * | 6/2007 | Srinivasan et al. | 714/719 |
| 7,370,148 B2 | 5/2008 | Ikeucho et al. | |
| 2007/0079218 A1 * | 4/2007 | Nagai et al. | 714/763 |
| 2008/0250270 A1 | 10/2008 | Bennett | |
| 2008/0301530 A1 * | 12/2008 | Spanel et al. | 714/765 |
| 2011/0071987 A1 * | 3/2011 | Davis et al. | 707/687 |
| 2011/0214033 A1 * | 9/2011 | Yoshii et al. | 714/758 |
| 2012/0072680 A1 * | 3/2012 | Kimura et al. | 711/154 |
| 2012/0221888 A1 * | 8/2012 | Frost et al. | 714/6.3 |
| 2012/0260150 A1 * | 10/2012 | Cideciyan et al. | 714/773 |
| 2012/0266050 A1 * | 10/2012 | Cideciyan et al. | 714/773 |
| 2013/0073902 A1 * | 3/2013 | Davis et al. | 714/15 |

FOREIGN PATENT DOCUMENTS

| | | |
|---|---|---|
| JP | 2006-252414 | 9/2006 |
| KR | 1020090129416 A | 12/2009 |

\* cited by examiner

*Primary Examiner* — Guerrier Merant
(74) *Attorney, Agent, or Firm* — Volentine & Whitt, PLLC

(57) ABSTRACT

A method is provided for operating a data storage device comprising a storage medium and a controller configured to control operations of the storage medium. The method comprises determining whether a read-requested data strip is an error data strip, reading a plurality of data strips in a stripe comprising the read-requested data strip when the read-requested data strip is the error data strip, outputting a data strip recovered using the other data strip except the error data strip among the plurality of data strips, and writing the recovered data strip and the other data strips into the storage medium.

19 Claims, 21 Drawing Sheets

DATA STORAGE DEVICE RELATED METHOD OF OPERATION

CROSS-REFERENCE TO RELATED APPLICATIONS

This application claims priority under 35 USC §119 to Korean Patent Application No. 10-2011-0032909 filed on Apr. 8, 2011, the subject matter of which is hereby incorporated by reference.

BACKGROUND OF THE INVENTION

The inventive concept relates generally to electronic data storage technologies. More particularly, the inventive concept relates to data storage devices and related methods of operation.

The information age has produced an explosive increase in the demand for personal data storage. With this increasing demand, various types of personal data storage devices have proliferated. For example, hard disk drives (HDDs) have been widely used due to various attractive features such as high recording density, high speed of data transmission, fast data access time, and low cost. Unfortunately, an HDD can be damaged by even slight shock and vibration due to its use of a platter and complex mechanical parts.

In recent years, solid-state disks or drives (SSDs) have been developed to replace HDDs. An SSD is a data storage device that uses a solid-state semiconductor memory as a main form of data storage. Unlike HDDs, SSDs do not include a platter and related mechanical parts. As a result, SSDs tend to have lower mechanical driving time and latency, and faster read/write times compared with HDDs. They also tend to have fewer errors due to latency and mechanical friction compared with HDDs, so their reliability in performing read/write operations tends to be better than that of HDDs. Moreover, SSDs generate relatively little heat and noise during operation, and they can withstand physical shock, which makes them increasingly more attractive than HDDs.

Due to the increasing popularity of SSDs, researchers are currently devoting great efforts to improving numerous aspects of their performance, including read/write speed, storage capacity, power consumption, reliability, durability, and many others.

SUMMARY OF THE INVENTION

In one embodiment of the inventive concept, a method is provided for operating a data storage device comprising a storage medium and a controller configured to control operations of the storage medium. The method comprises determining whether a read-requested data strip is an error data strip, reading a plurality of other data strips in a stripe incorporating the read-requested data strip upon determining that the read-requested data strip is the error data strip, generating a recovered data strip for the error data strip using the other data strips, and writing the recovered data strip and the other data strips into the storage medium.

In another embodiment of the inventive concept, a data storage device comprises a storage medium, a processing unit, and a controller configured to control an access operation of the storage medium under control of the processing unit, wherein when a read-requested data strip is an error data strip, the controller generates a recovered data strip using other data strips in a stripe comprising the read-requested data strip and writes valid data strips, among the recovered data strip and the other data strips, into the storage medium.

In another embodiment of the inventive concept, a method is provided for operating a data storage device comprising a storage medium and a controller. The method comprises receiving a read request for a data strip belonging to a data stripe, wherein the data stripe comprises the data strip, other data strips, and a parity strip generated from the data strip and the other data strips, determining whether the data strip contains an error and upon determining that the data strip contains the error, recovering the data strip by performing an XOR operation on the other data strips.

These and other embodiments of the inventive concept can potentially improve the performance and reliability of a data storage device such as an SSD or HDD.

BRIEF DESCRIPTION OF THE DRAWINGS

The drawings illustrate selected embodiments of the inventive concept. In the drawings, like reference numbers indicate like features.

DETAILED DESCRIPTION

Selected embodiments of the inventive are described below with reference to the drawings. These embodiments are presented as teaching examples and should not be construed to limit the scope of the inventive concept.

Figure 1:
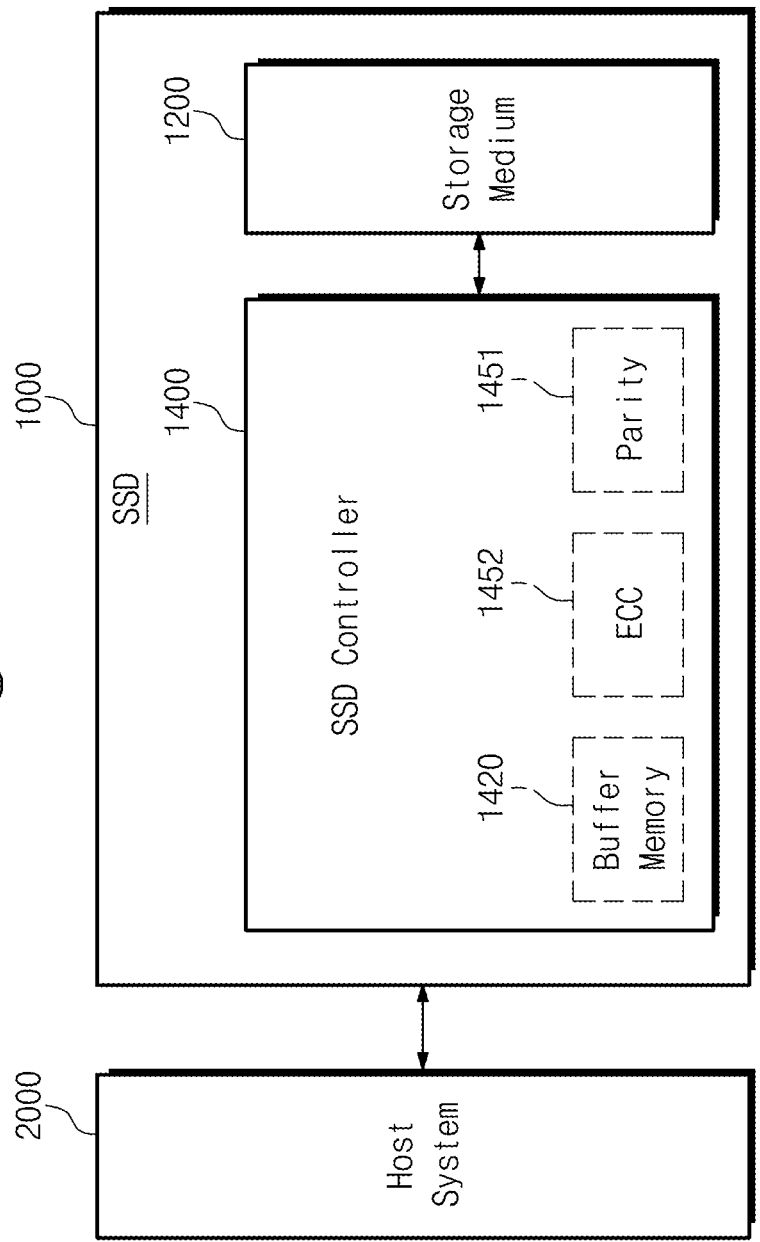
FIG. 1 is a block diagram of a system comprising a data storage device according to an embodiment of the inventive concept.

FIG. 1 is a block diagram of a system comprising a data storage device 1000 according to an embodiment of the inventive concept.

Referring to FIG. 1, data storage device 1000 operates in response to requests from a host system 2000, and it is used to store data for host system 2000. Data storage device 1000 can be, for example, an SSD using nonvolatile memory devices to store data. However, data storage device 1000 is not limited to an SSD, and it can comprise another type of data storage device 1000 such as an HDD.

Data storage device 1000 comprises a storage medium 1200 and an SSD controller 1400. SSD controller 1400 comprises a buffer memory 1420, an ECC generator 1452, and a parity generator 1451. Storage medium 1200 stores data received from host system 2000 and data to be transmitted to host system 2000 under the control of SSD controller 1400.

Data transmitted from host system 2000 to data storage device 1000 can be temporarily stored in buffer memory 1420. SSD controller 1400 manages address mapping of the data temporarily stored in buffer memory 1420 through the use of strip groups. For example, where random or sequential write data from host system 2000 is stored in buffer memory 1420, SSD controller 1400 can manage address mapping of the stored write data based on strip groups regardless of a type of a corresponding write request.

A strip group comprises a plurality of strips, such as data strips, where a strip is a unit of data defined according to the type of memory constituting storage medium 1200. For example, where storage medium 1200 comprises flash memory devices, a strip typically comprises one or more pages because flash memory devices typically read and write data in page units. Nevertheless, a strip can take alternative forms, such as a sector(s) less than one page, or a block(s) of pages.

Where buffer memory 1420 stores one or more strip groups, SSD controller 1400 transmits each strip group as a unit to storage medium 1200. Prior to such transmission, parity generator 1451 generates a parity strip for each strip group by performing an exclusive OR (XOR) operation on the corresponding data strips. The parity strip is then added to the data strips, and the combined strips are transmitted to storage medium 1200 together. This combination of data strips and a parity strip can be referred to as a "stripe", or a full-stripe-write unit. The parity strip can be stored in storage medium 1200 together with the data strips of the strip group, in an operation referred to as a "full-stripe-write" operation. Where a stripe is transmitted to storage medium 1200, ECC generator 1452 generates ECC information for each of the corresponding data and parity strips. The ECC information then is added to each of the data and parity strips in the stripe.

In some embodiments, instead of a full-stripe-write operation, a write operation is performed in units of strips. For example, where a new strip is stored in buffer memory 1420, it can be transmitted to storage medium 1200 through a flash memory controller 1450 (See, FIG. 2). At this point, ECC generator 1452 of flash memory controller 1450 generates and adds ECC information to the new strip, and parity generator 1451 stores the new strip to generate a parity strip. The generation of such a parity strip is described in further detail below.

Figure 2:
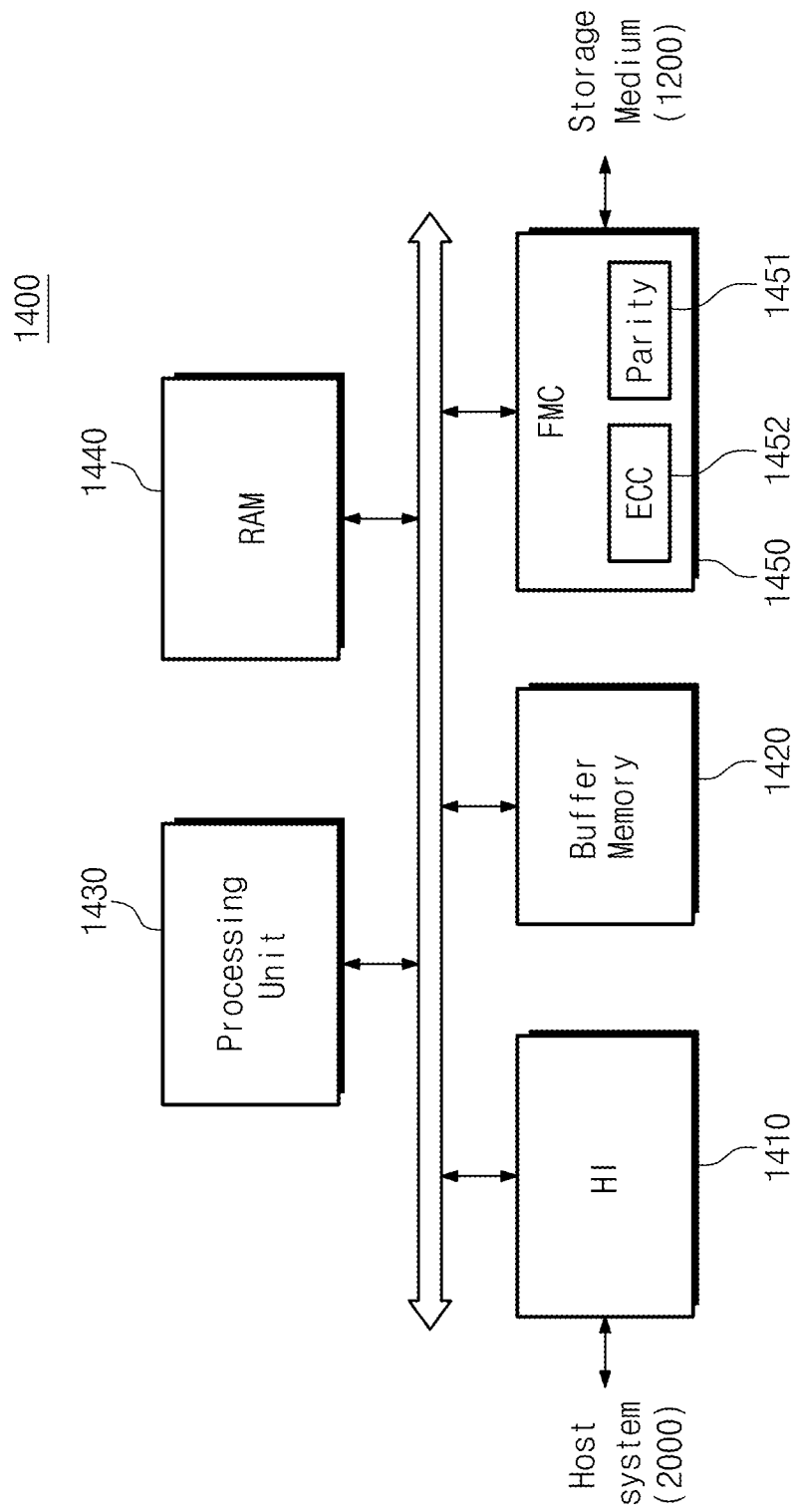
FIG. 2 is a block diagram of an SSD controller in a data storage device according to an embodiment of the inventive concept.

FIG. 2 is a block diagram of SSD controller 1400 according to an embodiment of the inventive concept.

Referring to FIG. 2, SDD controller 1400 comprises a host interface (HI) 1410, buffer memory 1420, a processing unit 1430 such as a microprocessor or a central processing unit (CPU), a random access memory (RAM) 1440, and flash memory controller (FMC) 1450.

Host interface 1410 provides an interface between host system 2000 and data storage device 1000. The interface can be, for example, a wired and/or wireless host interface 1410. Buffer memory 1420 temporarily stores data received from host system 2000 or to be transmitted to host system 2000. Processing unit 1430 is configured to control operations of SSD controller 1400. Codes stored in storage medium 1200 when power is supplied to data storage device 1000, such as a flash translation layer (FTL), may be loaded into RAM 1440. Instead of a code RAM, a code ROM may be used to store the above-mentioned codes. The FTL is typically used to manage address mapping, wear-leveling of storage medium 1200, and data loss caused by unexpected interruption of power supply.

Flash memory controller 1450 controls access to storage medium 1200 in response to requests from processing unit 1430. Flash memory controller 1450 incorporates parity generator 1451 and ECC generator 1452. As indicated above, where one or more strip groups is provided through address mapping, data stored in buffer memory 1420 is transmitted to storage medium 1200 in units of strips or strip groups. Where a strip group is transmitted to storage medium 1200, parity generator 1451 generates a parity strip by performing an XOR operation on corresponding data strips. The XOR operation can be performed on multiple data strips, through a sequence of XOR operations performed on individual data strips. For example, parity generator 1451 may receive an initial data strip and store it without performing the XOR operation. Then, when a new data strip is received, parity generator 1451 can perform an XOR operation between the stored data strip and the new data strip and store the result in place of the previously stored data strip. This process can be repeated for other data strips in a strip group until a parity strip is generated for the entire strip group. After the last data strip is transmitted to storage medium 1200, the parity strip may be transmitted to storage medium 1200.

Where data strips belonging to a strip group are each transmitted to storage medium 1200, parity generator 1451 generates a parity strip by performing an XOR operation for the data strips. In addition, where data strips belonging to a strip group are each transmitted to storage medium 1200, ECC generator 1452 may generate ECC information for each of the data and the parity strip. As the ECC information on each of the data and parity strips is generated, the ECC information can be added to each of the data and parity strips constituting a stripe.

Although FIG. 2 shows parity generator 1451 and ECC generator 1452 incorporated in flash memory controller 1450, these features can be located elsewhere. For example, ECC generator 1452 can be incorporated in respective flash memory devices of storage medium 1200. Moreover, procedures for parity and ECC generation can be performed in ways other than those explained above.

Host interface 1410 can be implemented, for example, using one of various computer bus standards, storage bus standards, and iFCPPeripheral bus standards, or a combination thereof. Examples of computer bus standards include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, and HyperTransport. Examples of storage bus standards include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, and FCIP. Examples of iFCPPeripheral bus standards include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, and Multidrop Bus.

Figure 3:
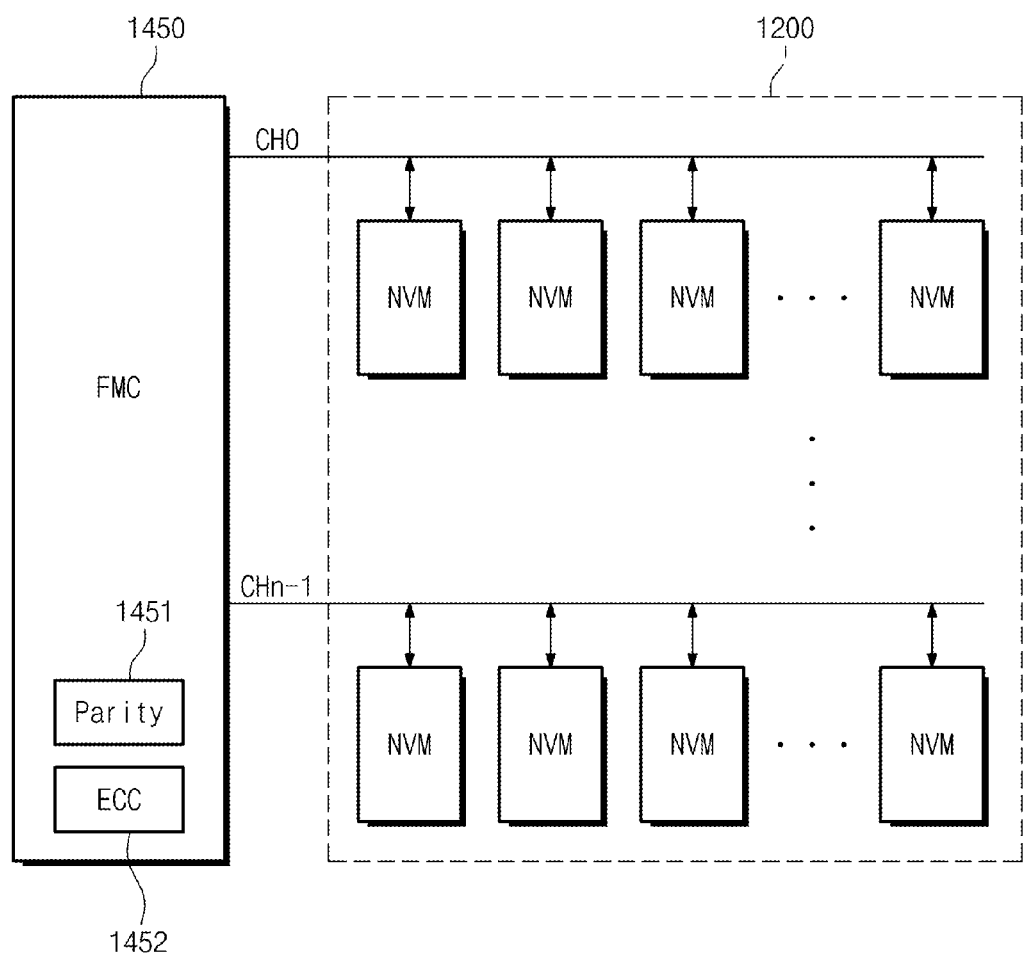
FIG. 3 is a block diagram of a storage medium in a data storage device according to an embodiment of the inventive concept.

FIG. 3 is a block diagram of storage medium 1200 shown in FIG. 2 according to an embodiment of the inventive concept.

Referring to FIG. 3, storage medium 1200 is connected to flash memory controller 1450 of SSD controller 1400 through a plurality of channels CH0~CHn−1. Storage medium 1200 comprises a plurality of nonvolatile memory devices (NVMs), which can be, for example, flash memory devices, phase change memory devices (PRAMs), ferroelectric memory devices (FeRAMs), or magnetoresistive RAMs (MRAMs). For convenience of explanation, it will be assumed that these NVMs are flash memory devices.

Figure 4:
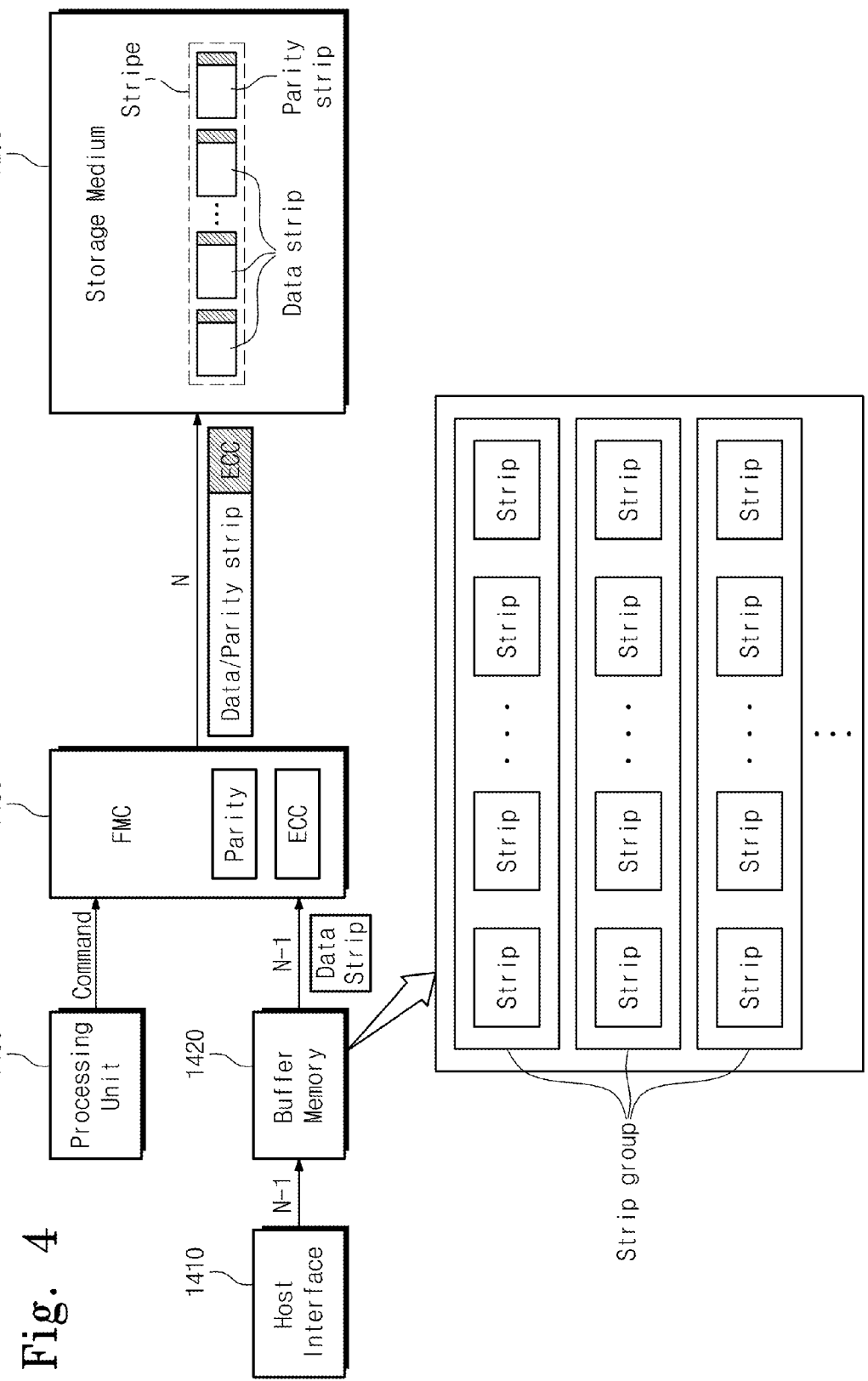
FIG. 4 is a block diagram illustrating data flow of a full-stripe-write operation performed in a data storage device according to an embodiment of the inventive concept.

FIG. 4 is a block diagram illustrating data flow based on a full-stripe-write operation performed in data storage device 1000 according to an embodiment of the inventive concept.

Referring to FIG. 4, data provided from host system 2000 is stored in buffer memory 1420 through host interface 1410. The data stored in buffer memory 1420 can be provided according to a random or sequential write request of host system 2000. For example, buffer memory 1420 may be accessed (N−1) times to store write data to be transmitted from host system 2000 in buffer memory 1420. As shown in FIG. 4, the data stored in buffer memory 1420 is organized into strip groups. This organization of data into strip groups is accomplished by address mapping of a flash translation layer (FTL). In general, the number of strips (or data strips) in each strip group can vary with applications.

Once one or more strip groups are formed, data (or data strips) in a strip group is transmitted to storage medium 1200 under the control of processing unit 1430. Flash memory controller 1450 transmits a data strip to storage medium 1200 in response to a write command provided from processing unit 1430. ECC generator 1452 generates ECC information for a transmitted data strip and adds the ECC information to the data strip. While the data strips belonging to one strip group are sequentially transmitted to storage medium 1200, parity generator 1451 of flash memory controller 1450 generates a parity strip by performing an XOR operation for the transmitted data strips. The generated parity strip is then transmitted to storage medium 1200. A stripe stored in storage medium 1200 can include data strips and a parity strip.

FIGS. 5 through 9 are flowcharts illustrating various methods performed by flash memory controller 1450. FIGS. 10 through 20 are diagrams illustrating various methods performed by flash memory controller 1450.

Figure 5:
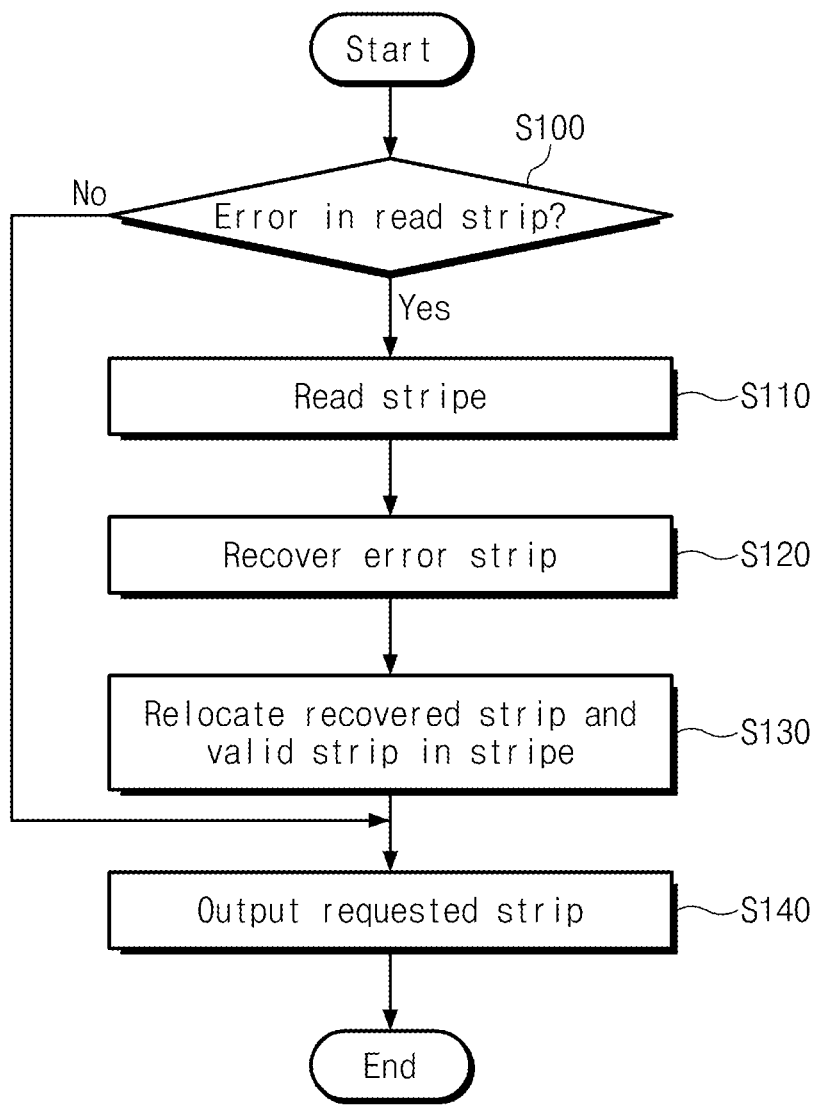
FIG. 5 is a flowchart illustrating the operation of a flash memory controller where an error correction code (ECC) generator cannot correct an error detected in a data strip read from a storage medium according to an embodiment of the inventive concept.
Figure 10:
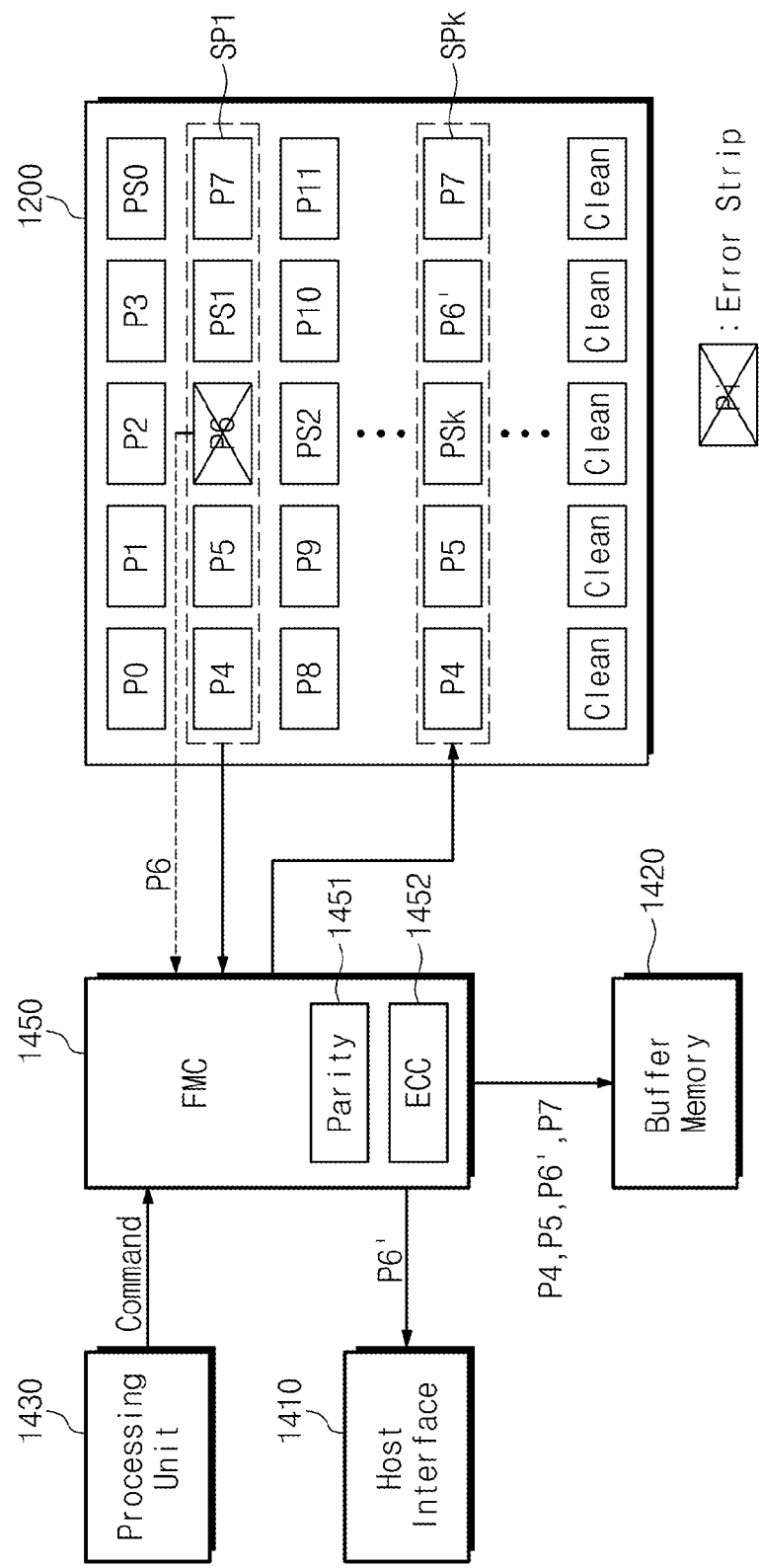
FIG. 10 is a diagram illustrating the operation of a flash memory controller where an error is contained in a data strip read from a storage medium according to an embodiment of the inventive concept.

FIG. 5 is a flowchart illustrating a method performed by flash memory controller where ECC generator 1452 does not correct an error detected in a data strip read from storage medium 1200, and FIG. 10 is a diagram illustrating the method of FIG. 5.

Referring to FIGS. 5 and 10, processing unit 1430 outputs a read command to flash memory controller 1450 when the read command is received from host system 2000. Flash memory controller 1450 reads a read-requested data strip P6 from storage medium 1200 in response to the read command.

Thereafter, flash memory controller 1450 determines whether the read data strip P6 includes an error that cannot be corrected by ECC generator 1452 (S100). If an error detected in the read data strip P6 can be corrected by ECC generator 1452 (S100=No), the error-corrected data strip P6 is transmitted to a host system 2000 through a host interface 1410 (S140). Otherwise, if the error detected in the read data strip P6 cannot be corrected by ECC generator 1452 (S100=Yes), flash memory controller 1450 reads a stripe ST1 including the read-requested data strip P6 (5110). Stripe ST1 comprises four data strips P4, P5, P6, and P7 and one parity strip PS1.

In the following explanation, it will be assumed that storage medium 1200 is capable of storing four stripes and each of the stripes comprises four data strips and one parity strip. However, storage medium 1200 is not limited to the described examples.

Flash memory controller 1450 performs an exclusive-OR (XOR) operation for data strips P4, P5, and P6 and parity strip PS1 in read stripe ST1 to recover an error-detected data strip P6 (S120). A result of the XOR operation for data strips P4, P5, and P6 and parity strip PS1 is output as a recovered data strip P6'. Flash memory controller 1450 stores valid data strips P4, P5, and P7 and the recovered data strip P6' of stripe ST1 in a buffer memory 1420.

If necessary (e.g., where at least one strip group is provided through address mapping), processing unit 1430 transmits a write command to flash memory controller 1450. When the write command is input, flash memory controller 1450 transmits data strips P4, P5, P6', and P7 provided from buffer memory 1420 to storage medium 1200 (S130). ECC generator 1452 generates ECC information based on the transmitted data and parity strips. Thereafter, the recovered data strip P6' is transmitted to host system 2000 through host interface 1410 (S140).

As indicated above, where error correction of a read data strip cannot be performed by ECC generator 1452, a stripe of a read-requested strip is read. A recovered data strip is calculated through an XOR operation for normal data strips and a parity strip in a read stripe. The recovered is transmitted to host system 2000, and the recovered data strip and valid data strips in a stripe are retransmitted to storage medium 1200. For this reason, data loss is minimized and reliability of a data storage device may be enhanced even when an error occurs at a storage medium.

Figure 6:
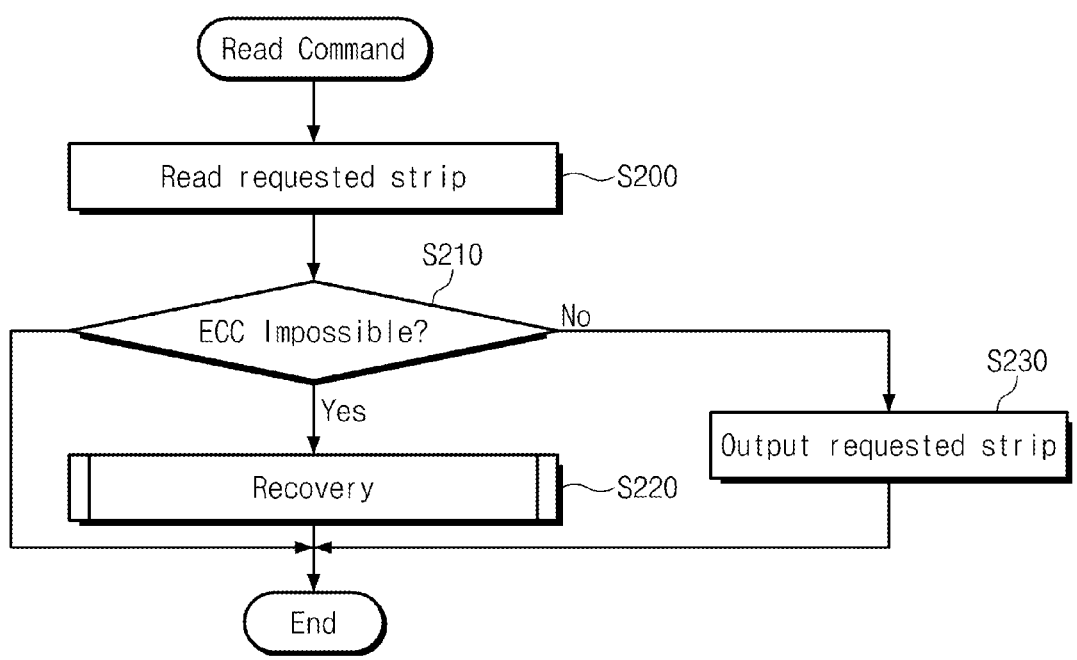
FIG. 6 is a flowchart illustrating the operation of a flash memory controller in response to a read command from a host according to an embodiment of the inventive concept.
Figure 11:
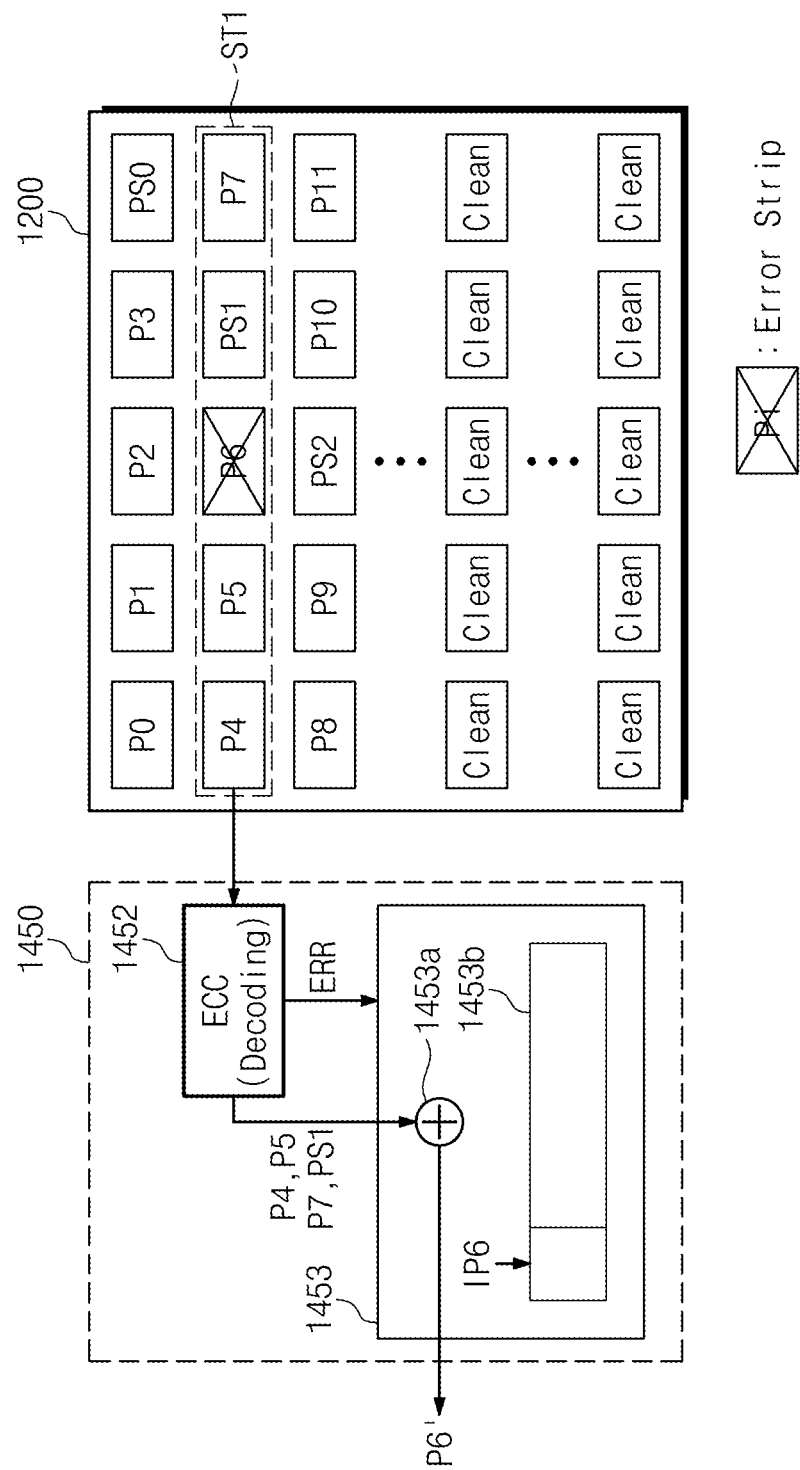
FIG. 11 is a diagram illustrating the operation of a flash memory controller where an ECC generator is unable to perform error correction on a data strip read from a storage medium according to an embodiment of the inventive concept.

FIG. 6 is a flowchart illustrating the operation of flash memory controller 1450 during execution of a read command from host system 2000. FIG. 11 illustrates the operation of flash memory controller 1450 where error correction of a data strip read from storage medium 1200 cannot be performed by ECC generator 1452.

Referring to FIG. 11, flash memory controller 1450 further comprises a control unit 1453 configured to control operations of flash memory controller 1450 and comprising an XOR operator 1453a and a queue 1453b. XOR operator 1453a performs XOR operations for input data, and queue 1453b is a memory having a first-in-first-out (FIFO) structure.

Referring to FIGS. 6 and 11, flash memory controller 1450 reads a read-requested data strip from storage medium 1200 in response to a read command (S200). It is assumed herein that the read-requested data strip is data strip P6. The read data strip P6 is decoded in ECC generator 1452, and it is determined whether the read data strip P6 contains any error that cannot be corrected (S210). If there is no error in the read data strip P6 or if existing errors can be corrected (S210=No), the read data strip P6 or error-corrected read data strip P6 is transmitted to host system 2000 through host interface 1410 (S230). Otherwise (S210=Yes), data strip P6 must be recovered using other strips P4, P5, and P7 and a parity strip PS1 in stripe ST1 including data strip P6. ECC generator 1451 outputs, to control unit 1453, an activated error signal ERR indicating that error correction cannot be performed with respect to data strip P6. Control unit 1453 executes a recovery process (S220) in response to the activation of error signal ERR.

Figure 7:
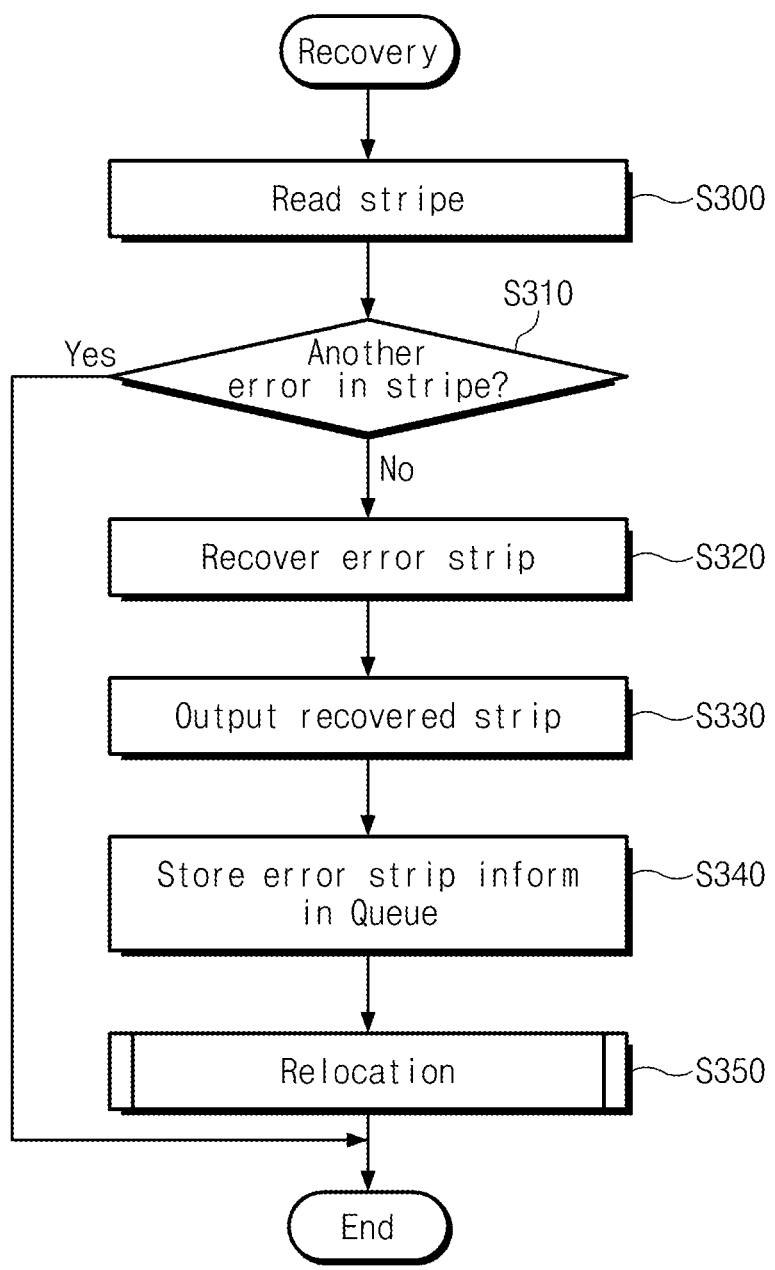
FIG. 7 is a flowchart illustrating a data recovery process of a control unit in a flash memory controller where an ECC generator is unable to perform error correction according to an embodiment of the inventive concept.

FIG. 7 is a flowchart illustrating a data recovery process performed by a control unit in flash memory controller 1450 when error correction is impossible by an ECC generator.

Referring to FIGS. 7 and 11, control unit 1453 controls all strips in stripe ST1 comprising an error-containing data strip P6 such that they are all output (S300). An ECC generator 1451 sequentially decodes read data strips P4, P5, P6, and P7 and a read parity strip PS1 in their read order while activating an error signal ERR when error correction is impossible.

When there is an error in the read stripe ST1, i.e., one of read strips P4, P5, P6, P7, and PS1, the strip containing the error (the "error strip", or "error data strip") can be recovered using an XOR operator 1453a. However, where there are errors in two or more strips, both error strips cannot be recovered. In this case, a response for a read command from a host system 2000 cannot be provided. Where there is an error in only one of strips P4, P5, P6, P7, and PS1 (S310=No), XOR operation 1453a executes an XOR operation for strips P4, P5, P7, and PS1 output from ECC generator 1451 (S320). A recovered data strip P6' may be calculated by the following Equation (1).

$$P6'=P4\, XOR\, P5\, XOR\, P7\, XOR\, PS1 \tag{1}$$

Control unit 1453 outputs the recovered data strip P6' from XOR operator 1453a to a host interface 1410 (S330). Therefore, it is possible to recover data strip P6 containing an error that cannot be corrected by ECC generator 1452. On the other hand, control unit 1453 stores information IP6 on the error data strip P6, i.e., an address of the error data strip P6 in a queue 153b (S340).

Flash memory controller 1450 executes a relocation process for stripe st1 comprising the recovered data strip P6' (S350). A predetermined value may be stored in a flag register (not shown) to call the relocation process. Alternatively, a triggering signal may be output to call the relocation process.

Figure 8:
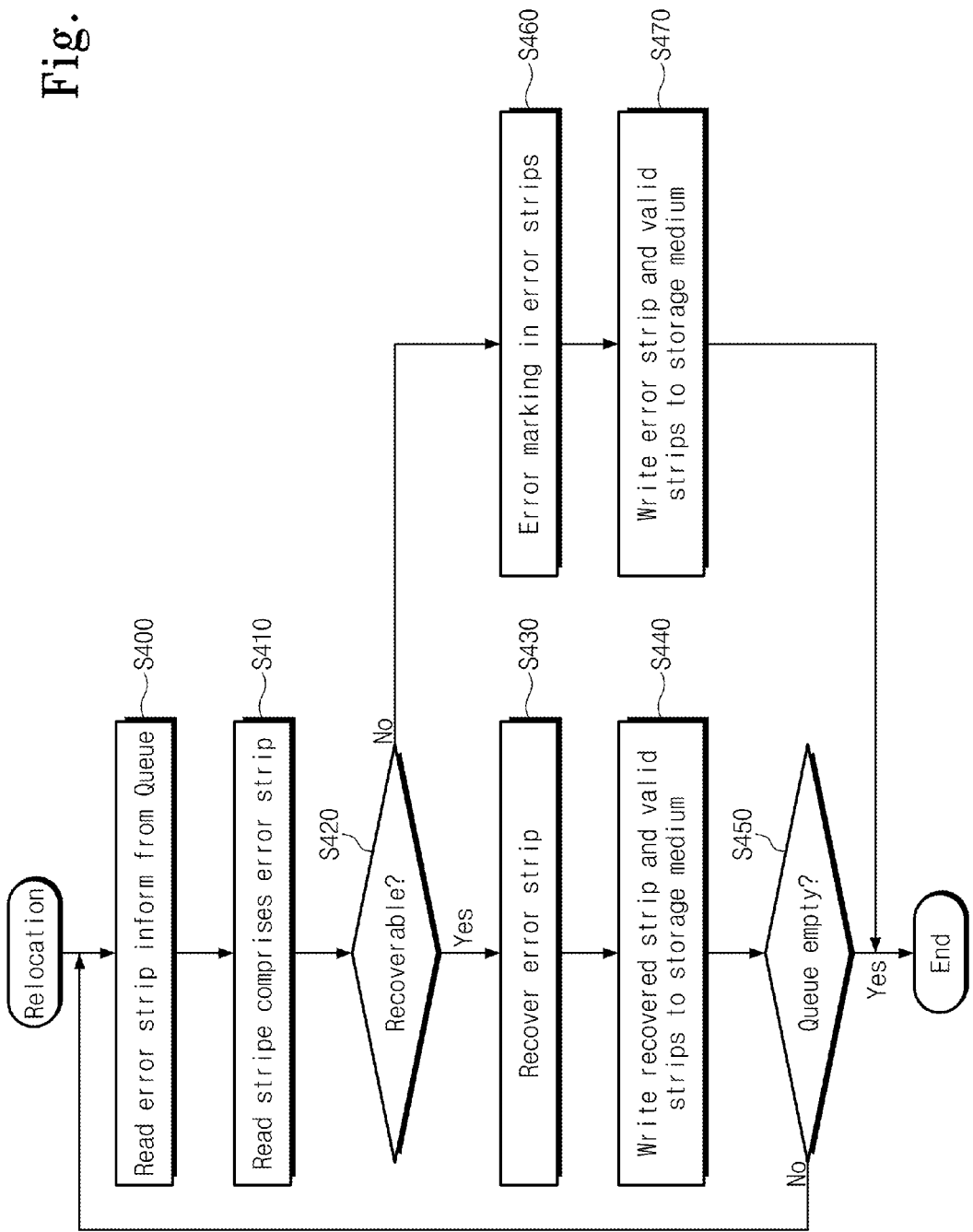
FIG. 8 is a flowchart illustrating a data relocation process of a flash memory controller according to an embodiment of the inventive concept.
Figure 12:
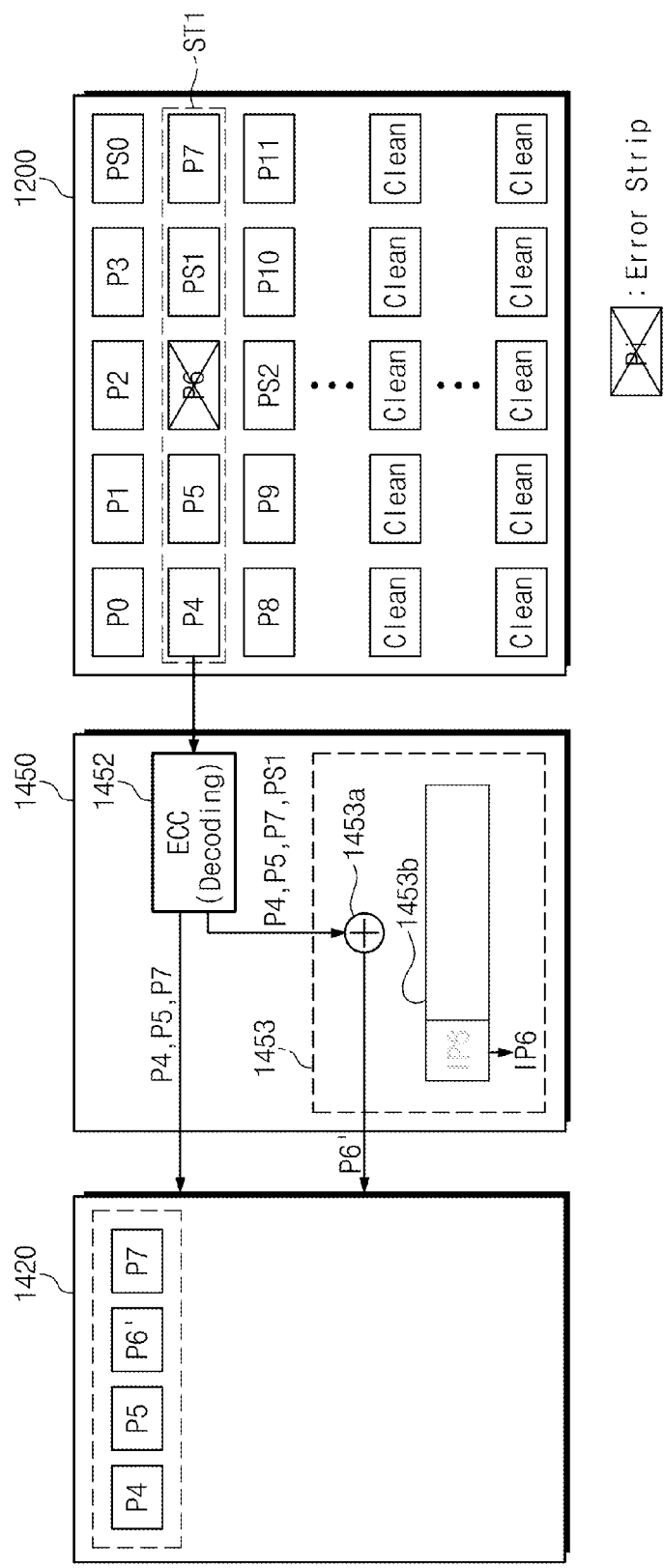
FIG. 12 is a diagram illustrating an example of the data relocation process of FIG. 8 according to an embodiment of the inventive concept.

FIG. 8 is a flowchart illustrating a data relocation process performed by flash memory controller shown 1450, and FIG. 12 is a diagram illustrating the data relocation process illustrated in FIG. 8.

Referring to FIGS. 8 and 12, control unit 1453 reads error data strip information IP6 from queue 1453b (S400). Queue 1453b becomes empty when the error data strip information IP6 is read by control unit 1453. Control unit 1453 reads data strips P4, P5, P6, and P7 and parity strip PS1 in stripe ST1 according to the read error data strip information IP6 (S410). ECC generator 1452 decodes the read strips P4, P5, P6, P7, and PS1 in their read order while activating an error signal ERR where error correction is impossible.

Where ECC generator 1452 is unable to perform error correction of two or more strips among read strips (S420=No), error recovery and relocation is impossible. In this case, control unit 1453 writes unrecoverable information into a meta data region of each error strip (S460), which is done to indicate that the strip is an error-containing data strip when there is a read request from a host system 2000 afterwards. Error strips and a valid data strip in a stripe are stored in a buffer memory 1420 to be written into a storage medium 1200 (S470).

If it is determined that there is an error in data strip P6 among the read strips (S420=Yes), control unit 1453 obtains a recovered data strip P6 by an exclusive OR operation for data strips P4, P5, and P7 and parity strip PS1 which is performed by an XOR operator 1453a (S430). The valid data strips P4, P5, and P7 in stripe ST1 output from ECC generator 1452 and a recovered data strip P6' from XOR operator 1453a are stored in buffer memory 1420 to be reprogrammed to storage medium 1200 (S440).

Figure 13:
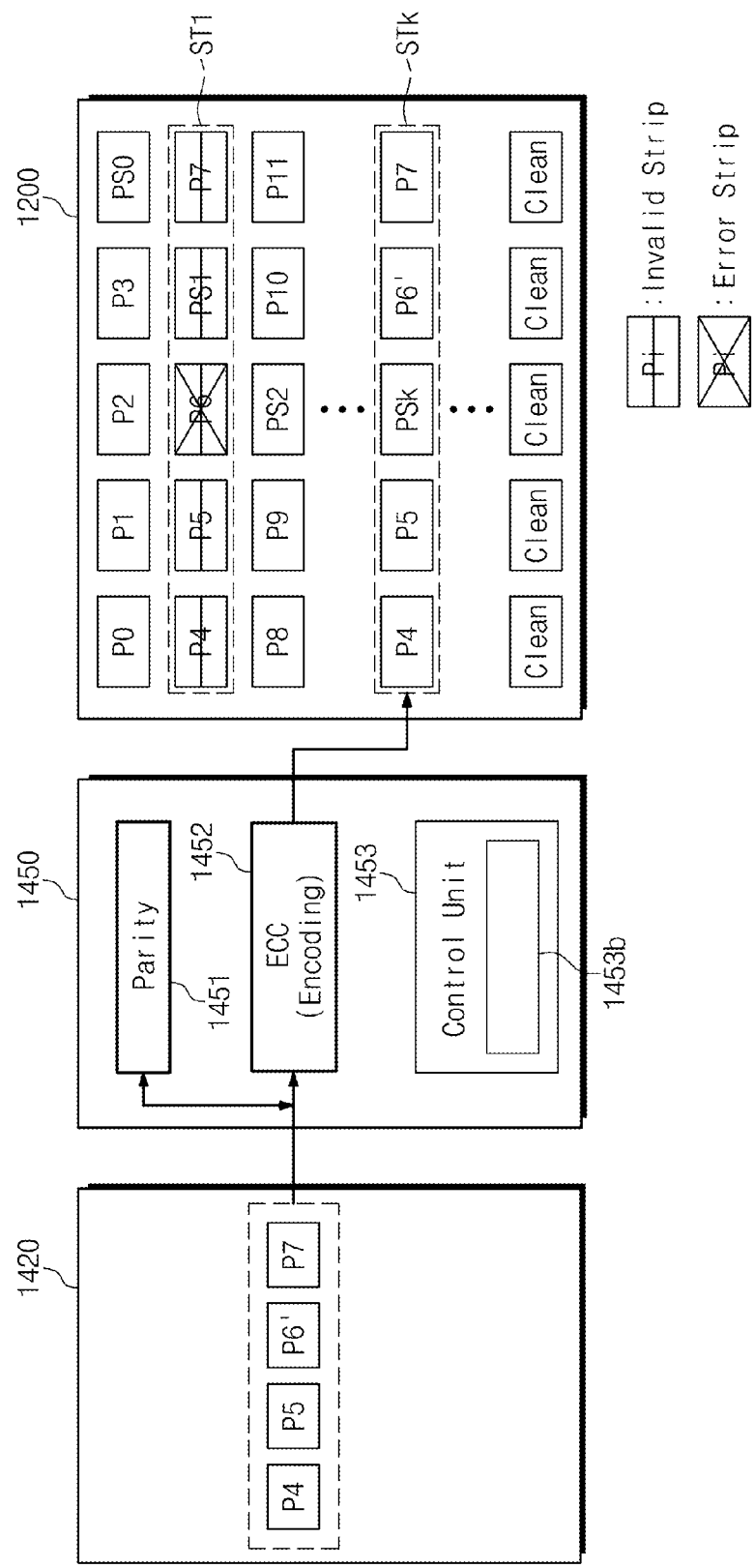
FIG. 13 is a diagram illustrating a method of storing a recovered strip and valid strips in a storage medium during the relocation process of FIG. 8 according to an embodiment of the inventive concept.

FIG. 13 illustrates an operation of storing a recovered strip and valid strips in a storage medium during the relocation process illustrated in FIG. 8 of flash memory controller 1450.

Referring to FIGS. 8 and 13, where data strips P4, P5, P6', and P7 constitute a strip group, SSD controller 1400 transmits data strips to storage medium 1200 in units strips or a strip group. As previously discussed in relation to FIG. 4, where data strips are stored in storage medium 1200 in units of strip group, parity generator 1451 can perform an XOR operation for the data strips when data strips P4, P5, P6', and P7 in the strip group are each transmitted to storage medium 1200. A parity strip PSk, which is a result of the XOR operation for data strip, is added to a strip group. Data strips P4, P5, P6', and P7 in the strip group and the added parity strip PSk may constitute one stripe STk. The added parity strip PSk may be stored in storage medium 1200 together with data strips P4, P5, P6', and P7 in the strip group. Where data strips in a strip group are each transmitted to storage medium 1200, ECC generator 1452 generates ECC information on each of data and parity strips. As the ECC information on each of the data and parity strips is generated, ECC information is added to the respective data and parity strips constituting a stripe. Data and parity strips P4, P5, P6', P7, and PSk in a new stripe STk are stored in storage medium 1200. Before the data and parity strips P4, P5, P6', P7, and PSk in new stripe STk are stored in storage medium 1200, data and parity strips in a previous stripe ST1 are each invalidated.

Where control unit 1453 reads error data strip information IP6 from queue 1453b, the error data strip information IP6 of queue 1453b is deleted. Therefore, no error data strip information is stored in queue 1453b.

As another example, where data strips are stored in storage medium 1200 in units of strips, data strip P4 is first transmitted to storage medium 1200. Parity generator 1451 stores data strip P4. ECC generator 1452 generates ECC information on data strip P4 and adds the ECC information to data strip P4. Data strip P4 to which the ECC information is added may be stored in storage medium 1200. Data strip P4 belongs to new stripe STk.

Next, data strip P5 is transmitted to storage medium 1200. Parity generator 1451 performs an XOR operation for data strip P5 and the previously stored data strip P4 and stores a result of the XOR operation. ECC generator 1452 generates ECC information for data strip P5 and adds the ECC information to data strip P6. Data strip P5 to which the ECC information is added is then stored in storage medium 1200.

Next, data strip P6' is transmitted to storage medium 1200. Parity generator 1451 performs an XOR operation for the result of the XOR operation for the previous data strips P4 and P5 and the new data strip P6' and stores a result of the XOR operation. ECC generator 1452 generates ECC information for data strip P6 and adds the ECC information to data strip P6. Data strip P6 to which the ECC information is added may be stored in storage medium 1200.

Finally, data strip P7 is transmitted to storage medium 1200. Parity generator 1451 performs an XOR operation for the result of the XOR operation for the previous data strips P4, P5, and P6' and the new data strip P7 and stores a result of the XOR operation. ECC generator 1452 generates ECC information on data strip P7 and adds the ECC information to data strip P7. Data strip P7 to which the ECC information is added is then stored in storage medium 1200. Parity strip PSk, which is a result of the XOR operation for data strips P4, P5, P6', and P7, is stored in storage medium 1200. Data strips P4, P5, P6', and P7 in the strip group and the added parity strip PSk constitute one stripe STk.

Referring again to FIG. 8, where queue 1453b is empty (S450=Yes), control unit 1453 ends the data relocation process. Otherwise, where error data strip information remains in queue 1453b (S450=No), control unit 1453 repeats the data relocation process.

Similarly where a data strip is read in response to a read command from host interface 1410, a data strip having an error that cannot be corrected by ECC generator 1452 may be identified. In this case, an error data strip may be recovered through an XOR operation for normal data strips and a parity strip in a stripe. If an error occurs in two or more data strips among the data and parity strips in the stripe, the data strips cannot be recovered. Thus, where an error occurs in a certain strip in a stripe, valid data strips and a recovered data strip in the stripe are re-stored in a storage medium to prevent recovery failure caused by an error occurring in two or more strips in the stripe. Reliability of a data storage device may be enhanced by performing such a fault-tolerance operation.

Where no command is received from host system 2000 for more than a predetermined time, SSD controller 1400 may perform a data scrubbing process to inspect storage medium 1200 and recover an error in the case where the error occurs.

The data recovery process described above in FIG. 7 operates in a blocking mode. That is, flash memory controller 1450 does not allow another operation or command to be inserted during the recovery process in FIG. 7. On the other hand, the data relocation process operates in a non-blocking mode. That is, after strips to be transmitted to storage medium 1200 are stored in buffer memory 1420, a new request received from host system 2000 may be processed. Thus, the relocation process may be executed without a bottleneck phenomenon with respect to a read/write request from host system 2000.

Figure 9:
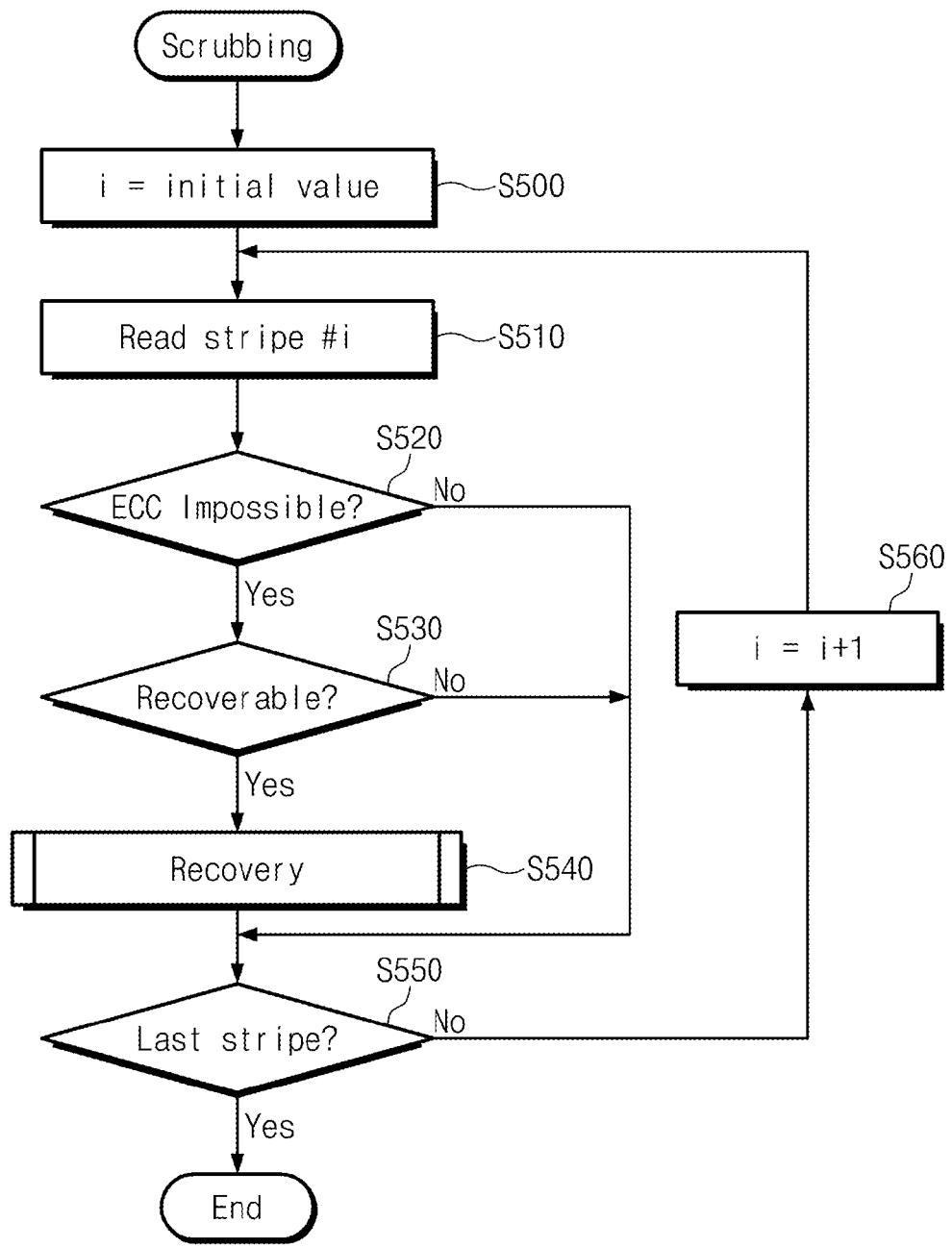
FIG. 9 is a flowchart illustrating a data scrubbing process of a flash memory controller according to an embodiment of the inventive concept.

FIG. 9 is a flowchart illustrating a data scrubbing process of flash memory controller 1450 according to an embodiment of the inventive concept.

Referring to FIG. 9, flash memory controller 1450 sets an initial value of an inspection position (i) of a storage medium 1200 (S500). Next, flash memory controller 1450 reads data and parity strips in a stripe designated by the inspection position (i) of storage medium 1200 (S510). Thereafter, flash memory controller 1450 checks the number of strips whose error correction is impossible by an ECC generator 1452, among the read data and parity strips (S520). If there is a strip having errors that cannot be corrected by ECC generator 1452 (S520=Yes), the errors may be corrected through a recovery process (S530=Yes) such as that illustrated in FIG. 7 (S540). If there are two or more strips for which error correction is impossible by ECC generator 1452, they cannot be recovered.

If the inspection position (i) designates the last stripe of storage medium 1200 (S550=Yes), the data scrubbing process is completed. If the inspection position (i) does not designate the last stripe of storage medium 1200 (S550=No), flash memory controller 1450 changes the inspection position (i) to designate the next stripe and repeatedly executes the data scrubbing process (S560).

SSD controller 1400 may execute a data scrubbing process during an idle time in which no command is received from a host system 2000 or according to a specific command. Due to the data scrubbing process, reliability of data storage device 1000 may be enhanced and execution frequency of a recovery process may decrease when a read command is received from host system 2000. Thus, response speed of data storage device 1000 may be improved.

Figure 14:
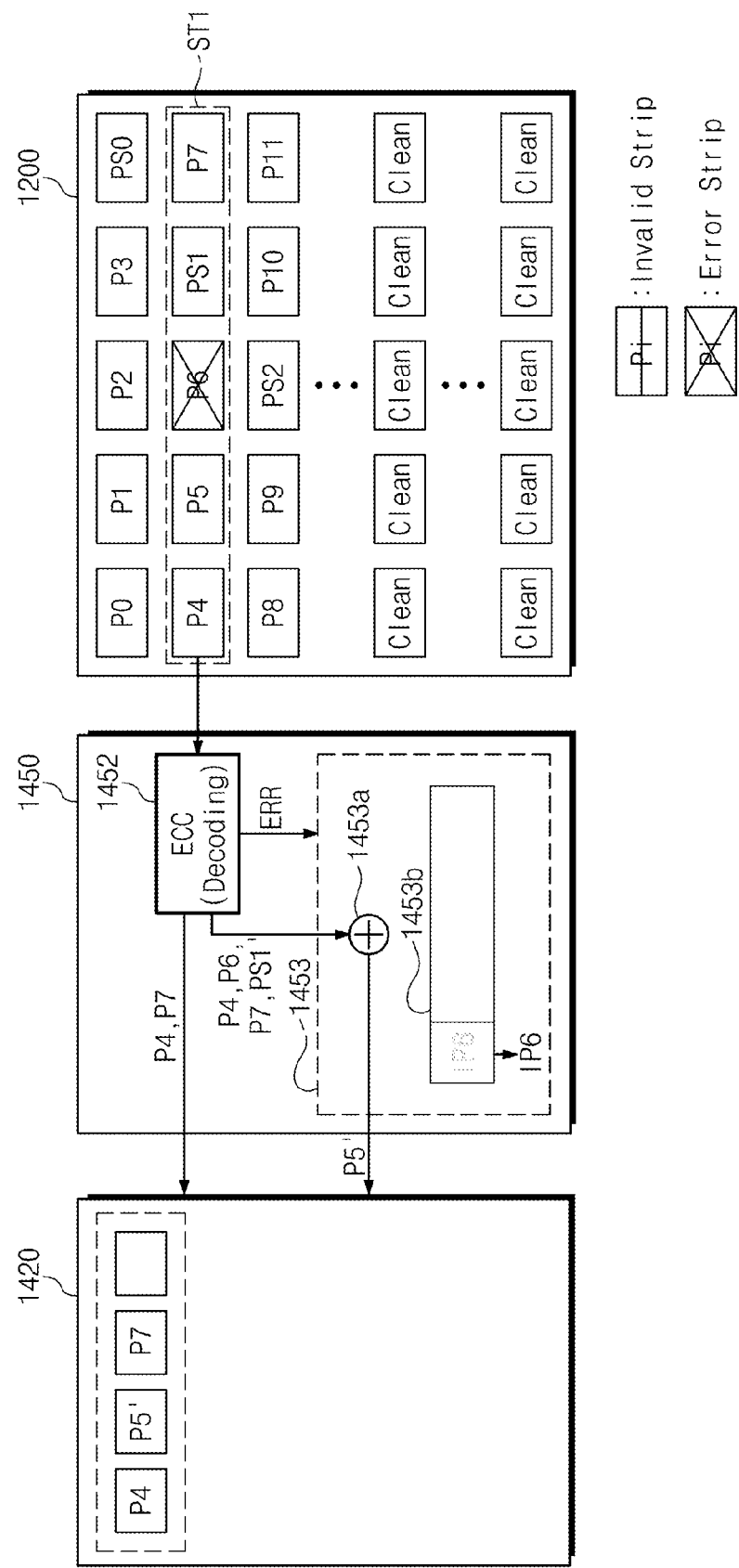
FIG. 14 is a diagram illustrating an example of operations performed by a flash memory controller according to an embodiment of the inventive concept.

FIG. 14 illustrates another example of the operation of flash memory controller 1450.

Referring to FIG. 14, it is assumed that a read request for a data strip P5 is received from host system 2000 to determine that error correction of a data strip P5 read during a read process shown in FIG. 6 or a data scrubbing process shown in FIG. 9 is impossible by an ECC generator 1452. Under the assumption, flash memory controller 1450 may read data and parity strips P4, P5, P6, P7, and PS1 in stripe ST1 comprising the read data strip P5. Although parity strip P6 is already an invalid strip, it may be read to recover data strip P5. Control unit 1453 controls not only valid strips P4, P7, and PS1 but also invalid strip P6 to be subjected to an XOR operation by XOR operator 1453a. A recovered data strip P5' is obtained as a result of the XOR operation for the data and parity strips P4, P6, P7, and PS1. The valid data strips P4 and P7 and the recovered data strip P5' in stripe ST1 are stored in a buffer memory 1420 to be re-stored in storage medium 1200. If a new data strip is stored in buffer memory 1420 through host interface 1410 to form a strip group, the strip group may be subsequently transmitted to storage medium 1200.

Figure 15:
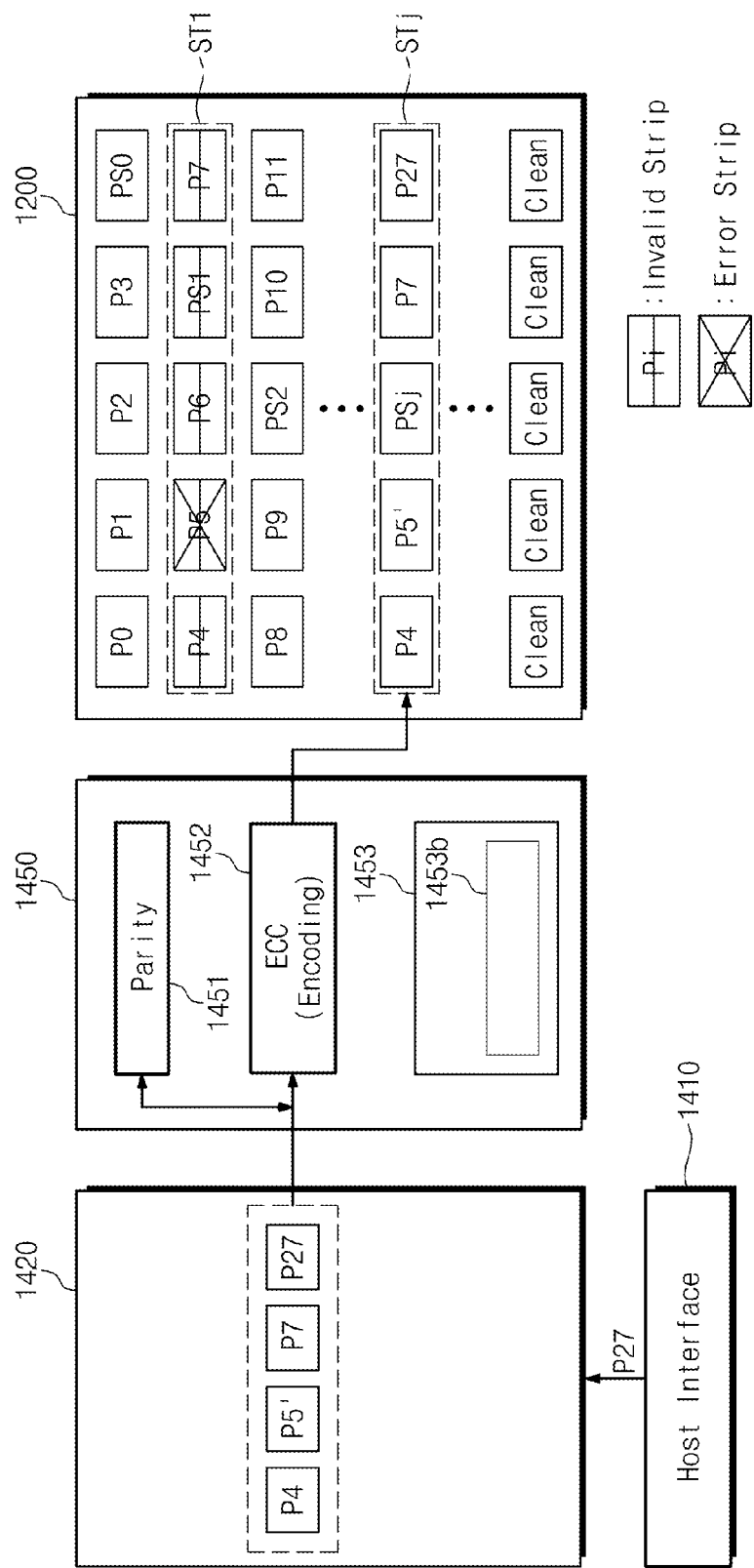
FIG. 15 is a diagram illustrating the operation of a flash memory controller where a new data strip is stored in a buffer memory through a host interface according to an embodiment of the inventive concept.

FIG. 15 illustrates the operation of a flash memory controller when a new data strip is stored through a host interface in buffer memory 1420 of FIG. 14.

Referring to FIG. 15, if a new data strip P27 is stored in buffer memory 1420 from host interface 1410 while data strips P4, P5', and P6 are stored in buffer memory 1420, one strip group is constituted. If data strips P4, P5', P6, and P27 constitute a strip group, SSD controller 1400 transmits data strips P4, P5', P6, and P27 to a storage medium 1200 in the unit of strip group. When data strips P4, P5', P6, and P27 belonging to the strip group are each transmitted to storage medium 1200, parity generator 1451 executes an XOR operation for data strips. A parity strip PSj, which is a result of the XOR operation, is added to a strip group. Data strips P4, P5', P6, and P27 belonging to the strip group and the added parity strip PSj constitute one stripe STj. The added parity strip PSj is stored in storage medium 1200 together with data strips P4, P5', P6, and P27 belonging to the strip group. When data strips belonging to a strip group are each transmitted to storage medium 1200, ECC generator 1452 is configured to generate ECC information on each of the data and parity strips. As the ECC information on each of the data and parity strips is generated, ECC information is added to each of data and parity strips constituting a stripe. Before the new stripe STj is stored in storage medium 1200, data and parity strips P4, P5, P6, PS1, and P7 in a previous stripe ST1 are each invalidated. Error data strip information IP5 is deleted, and there is no error data strip information in queue 1453b.

As previously described in relation to FIG. 13, in case of not a full-stripe-write operation but a strip unit write operation, data strips P4, P5', and P6 may be sequentially stored in storage medium 1200 by a write command even before the new data strip P27 are stored in buffer memory 1420. In this case, parity strip PSj for data strips P4, P5', P6, and P27 may be generated by parity generator 1451 after the new data strip P27 is input.

Figure 16:
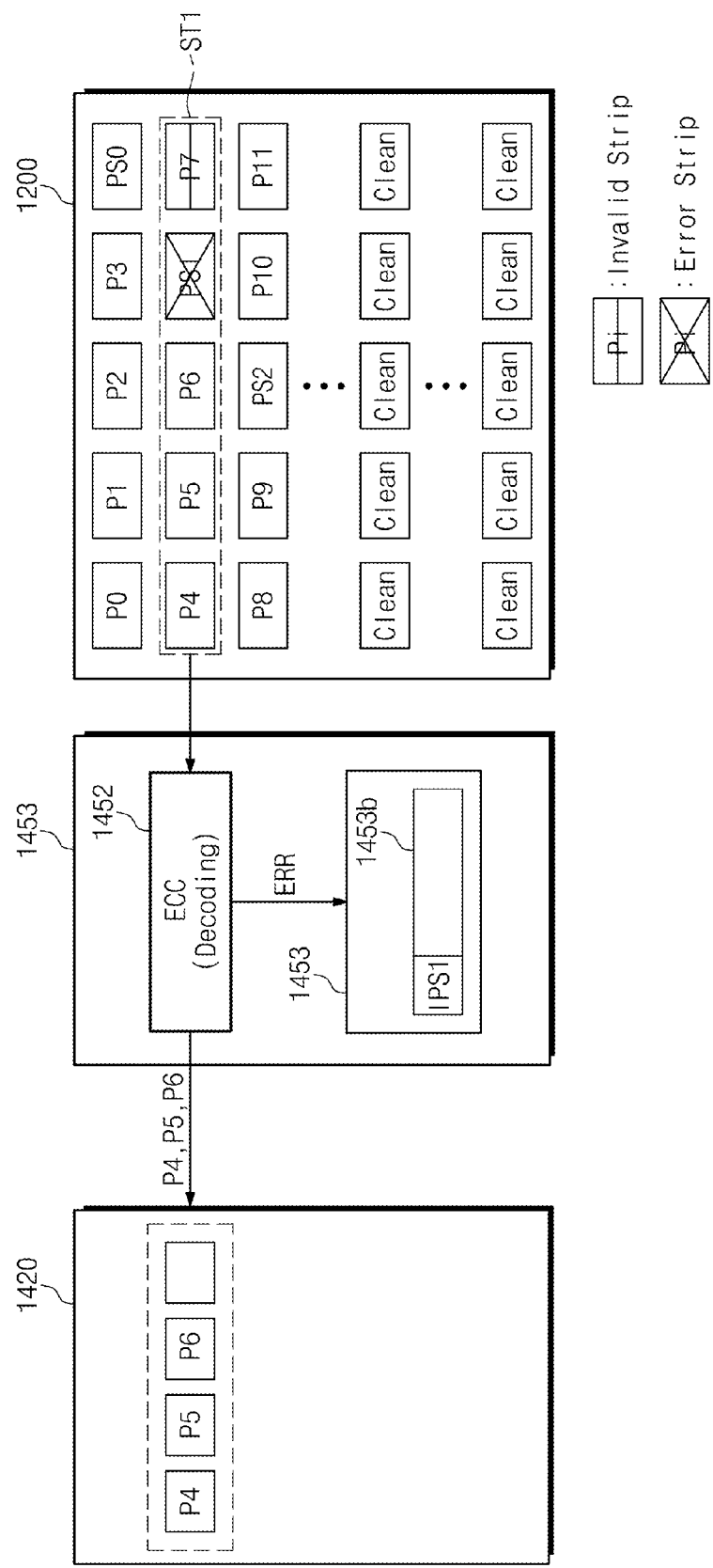
FIG. 16 is a diagram illustrating the operation of a flash memory controller where an ECC generator is unable to perform error correction on a parity strip stored in a storage medium according to an embodiment of the inventive concept.

It may be determined that error correction of a parity strip is impossible by an ECC generator 1452 during a data scrubbing process illustrated in FIG. 9. FIG. 16 illustrates the operation of the flash memory controller shown in FIG. 2 when error correction of a parity strip stored in a storage medium is impossible by ECC generator 1452.

Referring to FIG. 16, when error correction of a read parity strip PS1 is impossible by ECC generator 1452, flash memory controller 1450 reads valid data strips P4, P5, and P6 in stripe ST1 including parity strip PS1 and stores read strips P4, P5, and P6 in buffer memory 1420. In this case, flash memory controller 1450 need not read an invalid data strip P7. If a new data strip is stored in buffer memory 1420 through a host interface 1410 to constitute a strip group, the strip group may be transmitted to storage medium 1200. As described above, a data strip may be added to a new strip group when data strips belonging to the strip group are each transmitted to storage medium 1200.

Figure 17:
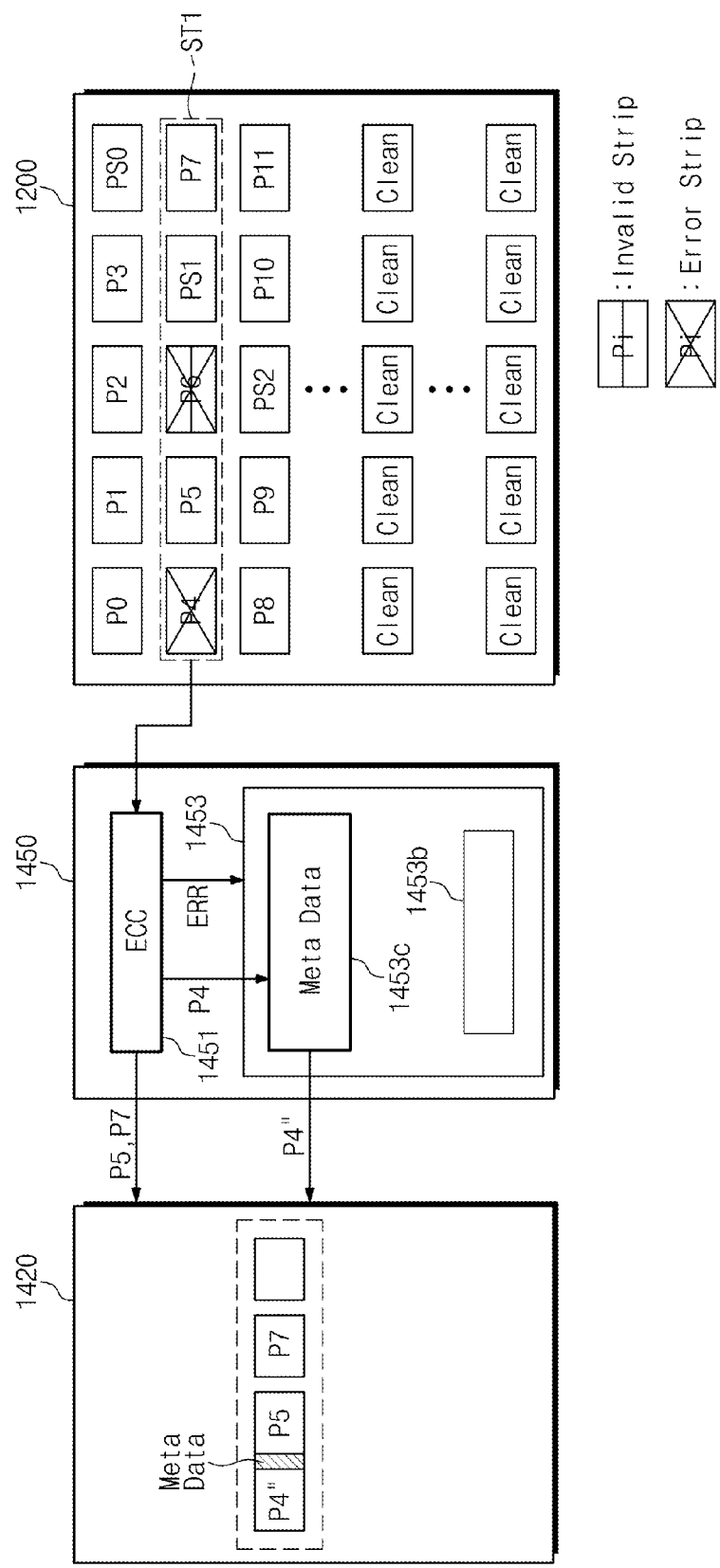
FIG. 17 is a diagram illustrating the operation of a flash memory controller where an ECC generator is unable to perform error correction on two data strips in a stripe according to an embodiment of the inventive concept.

FIG. 17 illustrates the operation of flash memory controller 1450 where error correction of two data strips in a stripe is impossible by an ECC generator according to an embodiment of the inventive concept.

Referring to FIG. 17, it may be determined that error correction of two data strips P4 and P6 is impossible by an ECC generator 1452 during a data scrubbing process illustrated in FIG. 9. In this case, the valid data strip P4 cannot be recovered. When a read request for data strip P4 is received from host system 2000, meta data may be added to data strip P4 to indicate that there is an error in data strip P4. Control unit 1453 further comprises a meta data generator 1453c. Meta data generator 1453c in control unit 1453 adds meta data to an error data strip P4 when error correction of two or more strips among data and parity strips of a read stripe ST1 is impossible by an ECC generator 1452. In this case, it is necessary to generate meta data on an already invalidated data strip P6. Valid data strips P5 and P7 in stripe ST1 and a data strip P4" to which meta data is added are stored in a buffer memory 1420. If a new data strip is stored through host interface 1410 to constitute a strip group in buffer memory 1420, the strip group may be transmitted to storage medium 1200.

Figure 18:
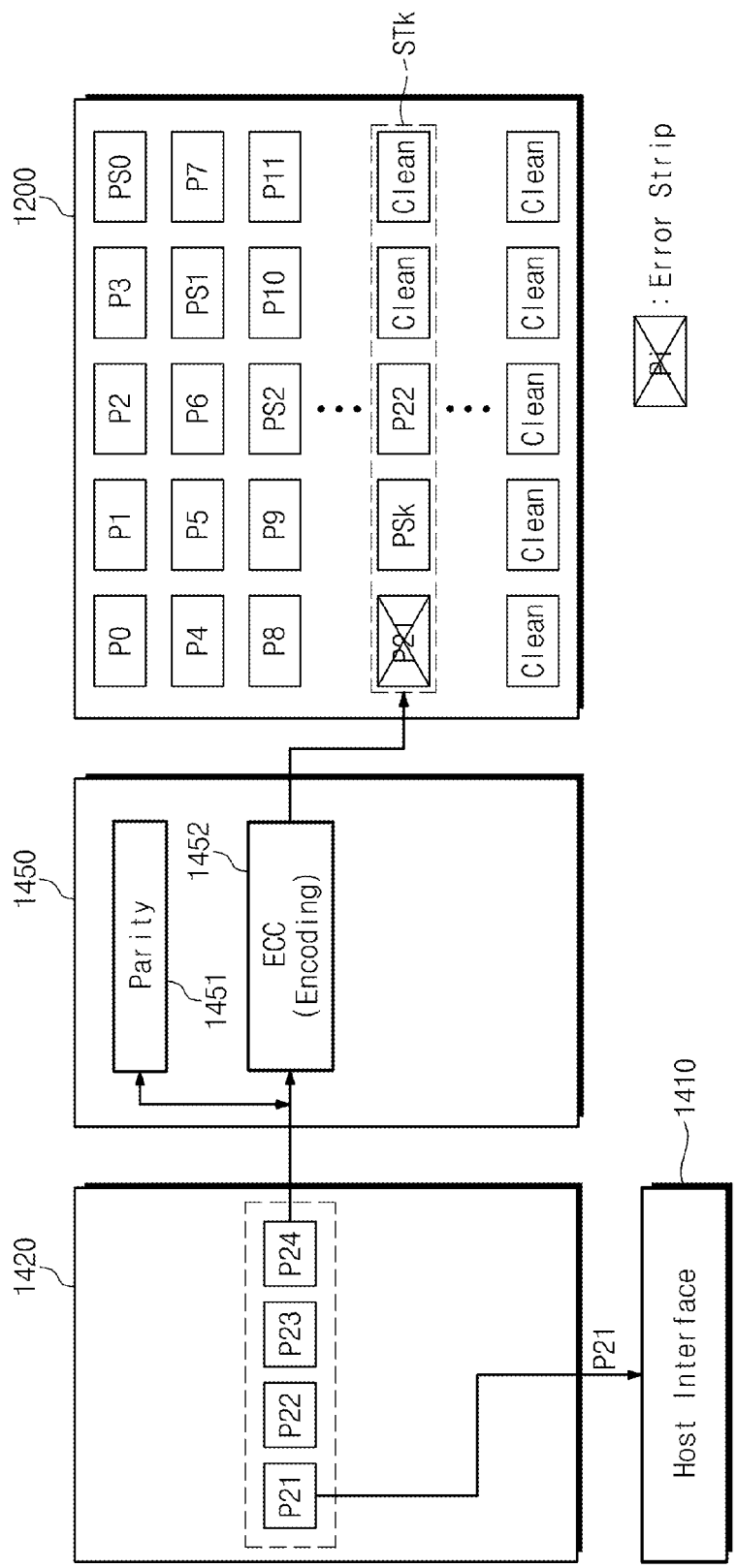
FIG. 18 is a diagram illustrating the operation of a flash memory controller where an ECC generator is unable to perform error correction on a data strip stored in a storage medium according to an embodiment of the inventive concept.

FIG. 18 illustrates the operation of flash memory controller 1450 where error correction of a data strip stored in storage medium 1200 is impossible by ECC generator 1452 when a read request is received from a host system before data and parity strips in a strip group are all transferred to the storage medium.

Referring to FIG. 18, data strips P21, P22, P23, and P24 in buffer memory 1420 constitute a strip group. In case of a strip unit write technique, data strips P21, P22, P23, and P24 may be sequentially transmitted to storage medium 1200. However, a read request for data strip P21 may be received before data strips P21, P22, P23, and P24 are all transmitted to storage medium 1200. This is because storage medium 1200 comprises a plurality of flash memory chips and data write operations for the respective flash memory chips are individually performed. Because there is a clean region in stripe STk, data strip P21 cannot be recovered by an XOR operation in the case where error correction of data strip P21 is impossible by ECC generator 1452.

In this case, SSD controller 1400 controls a data strip P21 stored in buffer memory 1420, instead of a data strip P21 stored in storage medium 1200, to be provided to host system 2000 through host interface 1410.

Figure 19:
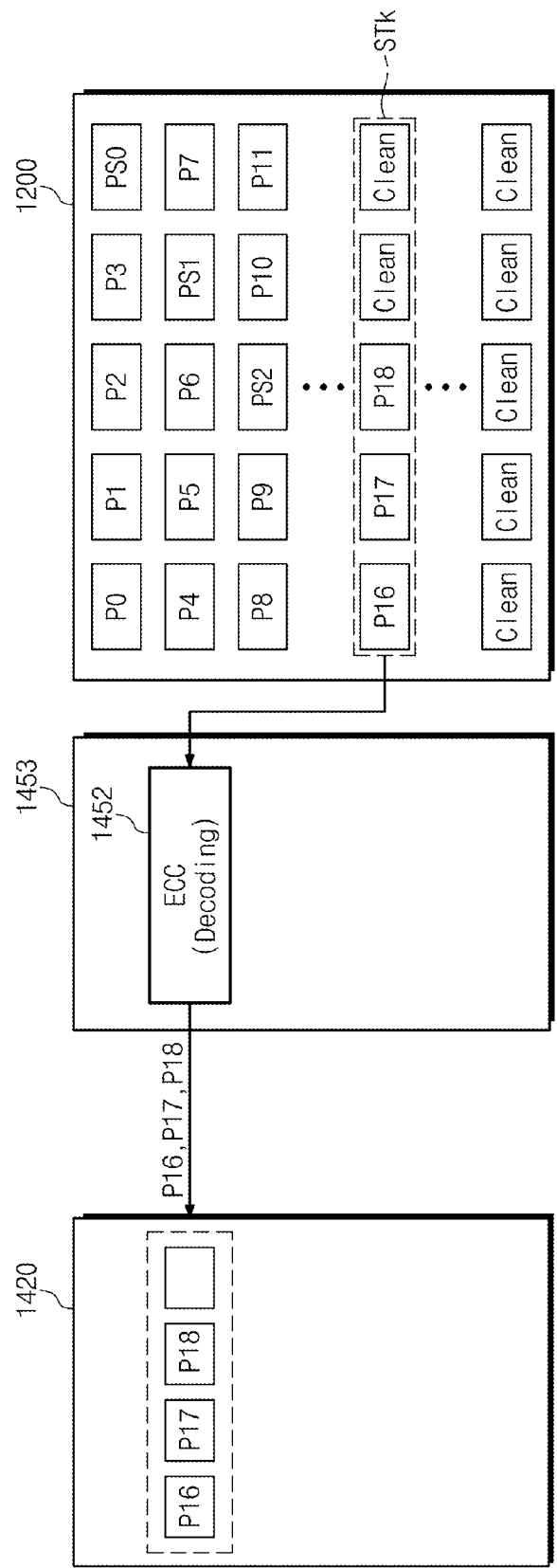
FIG. 19 is a diagram illustrating the operation of a flash memory controller where a clean strip is incorporated in a stripe stored in a storage medium according to an embodiment of the inventive concept.

FIG. 19 is a diagram illustrating a method performed by flash memory controller 1450 where a clean strip is included in a stripe stored in a storage medium according to an embodiment of the inventive concept.

Referring to FIG. 19, if sudden power off occurs during a data write operation, a part of data strips or a parity strip constituting a stripe may not be normally stored in a storage medium 1200. If a power supply is resumed, an initialization process for storage medium 1200 may be performed. If a clean strip is found during the initialization process, SSD controller 1400 reads valid data strips P16, P17, and P18 in a stripe and stores the read valid data strips P16, P17, and P18 in buffer memory 1420. Data strips P16, P17, and P18 stored in buffer memory 1420 may be transmitted to storage medium 1200 in the unit of stripe or full-stripe-write.

Figure 20:
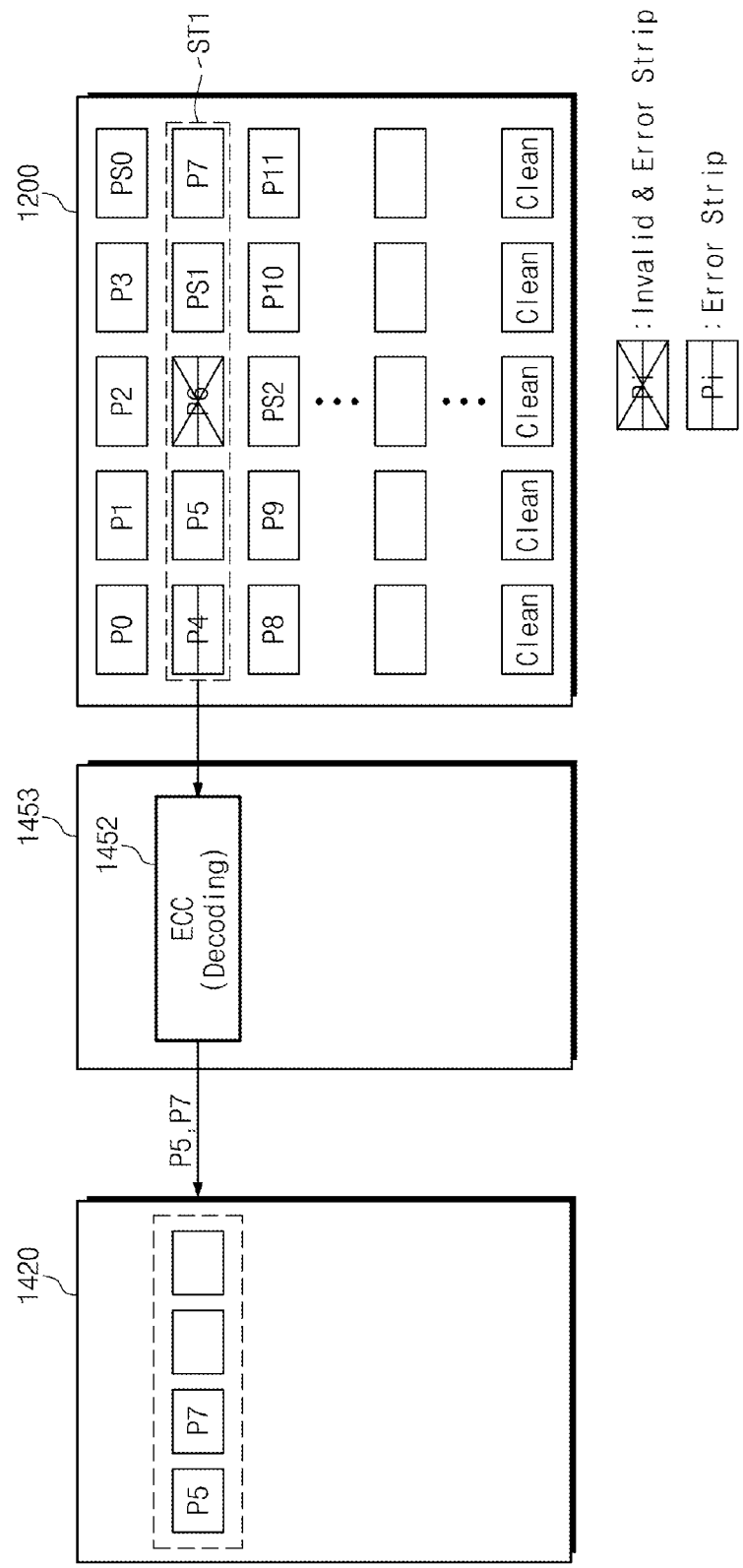
FIG. 20 is a diagram illustrating the operation of a flash memory controller where an ECC generator is unable to perform error correction of an invalidated data strip during a data scrubbing process according to an embodiment of the inventive concept.

FIG. 20 illustrates the operation of flash memory controller 1450 when error correction of an invalidated data strip is impossible by ECC generator 1452 during a data scrubbing process according to an embodiment of the inventive concept.

An already invalidated data strip P6 is typically not requested for reading by a host system 2000. However, if error correction of any one of valid data strips P5 and P7 in stripe ST1 is impossible when error correction of the invalidated data strip P6 is impossible, an XOR operation may not be performed to make recovery impossible. In order to prevent the read failure, it is necessary to inspect whether error correction of data strips P5 and P7 invalidated during a data scrubbing process is executed.

If error correction of the invalidated data strip P6 is impossible by ECC generator 1452, the valid data strips P5 and P7 in stripe ST1 are stored in buffer memory 1420. If a new data strip is stored in buffer memory 1420 through host interface 1410 to form a strip group, data strips P5 and P7 may be transmitted to storage medium 1200.

Figure 21:
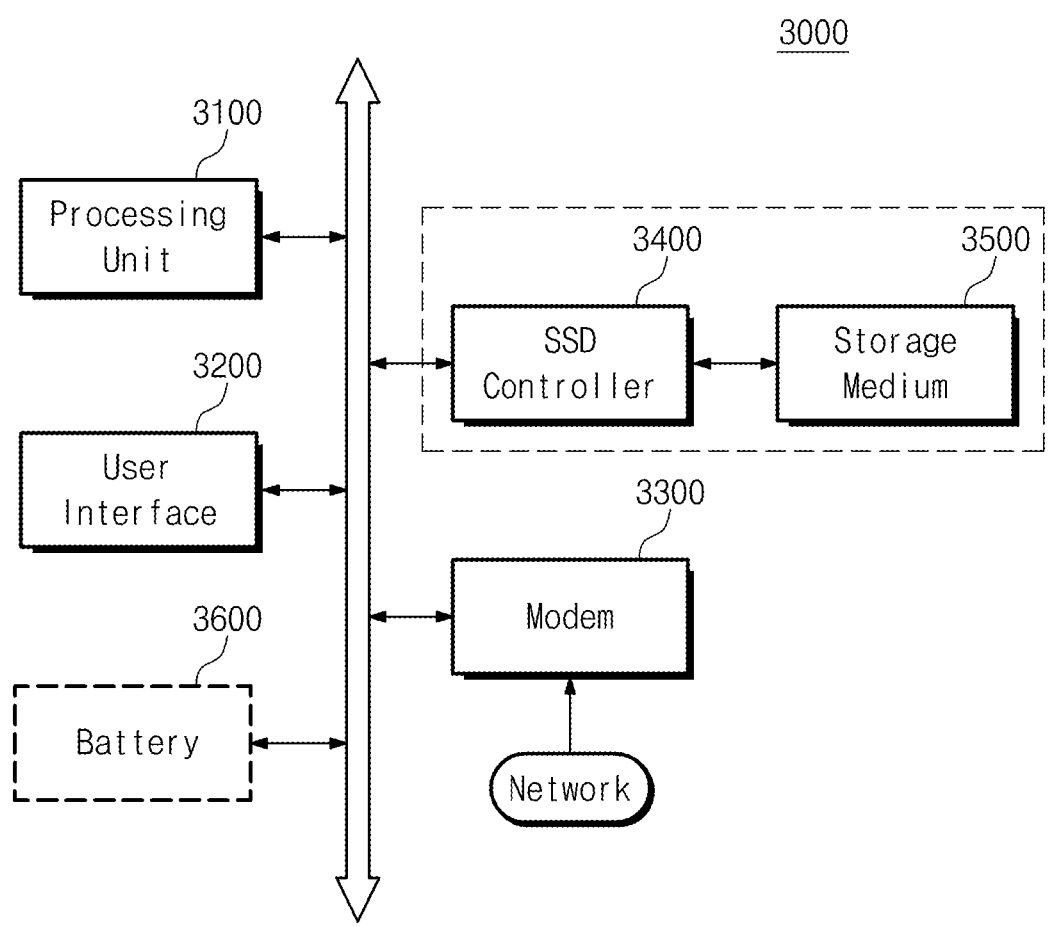
FIG. 21 is a block diagram of a computing system comprising a data storage device according to an embodiment of the inventive concept.

FIG. 21 is a block diagram of a computing system 3000 comprising a data storage device according to an embodiment of the inventive concept.

Referring to FIG. 21, computing system 3000 comprises a microprocessor 3100, a user interface 3200, a modem 4300 such as a baseband chipset, an SSD controller 3400, and a storage medium 3500. SDD controller 3400 and storage medium 3500 can be formed by data storage device 1000 of FIG. 1 and will not be described in further detail. N-bit data processed by microprocessor 3100 is stored in storage medium 3500 through SSD controller 3400. Where computing system 3000 is a mobile device, a battery 3600 may be additionally provided to supply a work voltage to computing system 3000. Although not illustrated in the drawings, it should apparent to those skilled in the art that an application chipset, a camera image processor (CIS), a mobile dynamic random access memory (DRAM), etc., may be further provided in computing system 3000 according to the inventive concept.

As indicated by the foregoing description, an error-containing data page in a stripe can be recovered using a parity page. Moreover, valid data pages in a stripe comprising the recovered data page constitute a new stripe to be stored in a data storage device. Although an error occurs in the data storage device, data loss can be minimized to enhance reliability of the data storage device.

While the inventive concept has been particularly shown and described with reference to embodiments thereof, it will be apparent to those of ordinary skill in the art that various changes in form and detail may be made therein without departing from the scope of the inventive concept as defined by the following claims.

What is claimed is:

1. A method of operating a data storage device comprising a storage medium and a controller configured to control operations of the storage medium, the method comprising:
   determining whether a read-requested data strip is an error data strip;
   reading a plurality of other data strips in a stripe incorporating the read-requested data strip upon determining that the read-requested data strip is the error data strip;
   generating a recovered data strip for the error data strip by performing an XOR operation on the other data strips; and
   writing the recovered data strip and the other data strips into the storage medium;
   wherein writing the recovered data strip and the other data strips in the storage medium comprises:
   reading information on the error data strip from a queue;
   reading the plurality of data strips in the stripe;
   outputting the recovered data strip generated by the XOR operation;
   storing the recovered data strip and valid data among the stripe in a buffer memory; and
   writing the recovered data strip and the valid data strips stored in the buffer memory into the storage medium in response to a write command.

2. The method of claim 1, wherein determining whether the read-requested data strip is an error data strip comprises:
   determining whether an error correction code (ECC) generator can perform error correction on the read-requested data strip, and upon determining that the ECC generator cannot perform error correction on the read-requested data strip, determining the read-requested data strip to be the error data strip.

3. The method of claim 2, wherein generating the recovered data strip comprises performing an XOR operation on the other data strips, and
   wherein the other data strips comprise valid and invalidated data strips.

4. The method of claim 3, wherein writing the recovered data strip and the other data strips into the storage medium comprises:
   storing the valid data strips in a buffer memory.

5. The method of claim 4, wherein at least one of the plurality of data strips in the stripe is a parity strip.

6. The method of claim 5, wherein writing the recovered data strip and the other data strips into the storage medium comprises:
   storing the valid data strips in a buffer memory where the error data strip is the parity strip.

7. The method of claim 1, further comprising outputting the recovered data strip as response data.

8. The method of claim 7, further comprising storing the information on the error data strip in the queue after outputting the recovered data strip as the response data.

9. The method of claim 1, wherein outputting the recovered data strip comprises:
   determining a number of error data strips among data strips in the stripe; and
   performing the XOR operation upon determining that the number of error data strips is one.

10. The method of claim 1, wherein the recovered data strip and the other data strips are repeatedly written into the storage medium until the queue becomes empty.

11. The method of claim 1, further comprising:
    performing a data scrubbing process, comprising:
    reading the other data strips in the stripe stored in the storage medium;
    outputting the recovered data strip upon determining that the read-requested data strip is the error data strip; and
    transmitting valid data strips, among the recovered data strip and the other data strips, to the storage medium; and
    repeating the data scrubbing process for a plurality of strips stored in the storage medium.

12. A data storage device comprising:
    a storage medium;
    a processing unit; and
    a controller configured to control an access operation of the storage medium under control of the processing unit, wherein when a read-requested data strip is an error data strip, the controller generates a recovered data strip using other data strips in a stripe comprising the read-requested data strip and writes valid data strips, among the recovered data strip and the other data strips, into the storage medium;
    wherein writing the valid data strips and the other data strips into the storage medium comprises:
    reading information on the error data strip from a queue;
    reading the plurality of data strips in the stripe;
    outputting the recovered data strip;
    storing the recovered data strip and the valid data strips in a buffer memory; and
    writing the recovered data strip and the valid data strips stored in the buffer memory into the storage medium in response to a write command.

13. The data storage device of claim 12, wherein at least one data strip in the stripe is a parity strip, and wherein when the error data strip is the parity strip, the controller stores the valid data strips.

14. The data storage device of claim 13, wherein the processing unit is configured to collect data strips from a buffer memory into a strip group, and further configured to provide a write command to the controller where at least one strip group is prepared in the buffer memory, and the write command accompanies an XOR operation for data strips of the at least one strip group when the data strips are each transmitted to the storage medium.

15. The data storage device of claim 12, wherein the controller further comprises an error correction code (ECC) generator, and the controller determines whether the ECC generator can perform error correction on the read-requested data strip, and upon determining that the ECC generator cannot perform error correction on the read-requested data strip, determines the read-requested data strip to be the error data strip.

16. The data storage device of claim 15, wherein the controller generates the recovered data strip by performing an XOR operation on the other data strips.

17. A method of operating a data storage device comprising a storage medium and a controller, comprising:
- receiving a read request for a data strip belonging to a data stripe, wherein the data stripe comprises the data strip, other data strips, and a parity strip generated from the data strip and the other data strips;
- determining whether the data strip contains an error and upon determining that the data strip contains the error, recovering the data strip by performing an XOR operation on the other data strips;
- reading information on the data strip containing the error from a queue;
- reading the other data strips in the stripe;
- outputting the recovered data strip produced by the XOR operation;
- storing the recovered data strip and valid data strips among the stripe in a buffer memory; and
- writing the recovered data strip and the valid data strips stored in the buffer memory into the storage medium in response to a write command.

18. The method of claim 17, wherein the storage medium comprises a plurality of nonvolatile memory devices, and the data stripe represents a logical grouping of data stored among the plurality of nonvolatile memory devices.

19. The method of claim 18, wherein the storage medium resides in a solid state drive.

* * * * *